United States Patent
Jeon et al.

(10) Patent No.: US 12,733,475 B2
(45) Date of Patent: Sep. 8, 2026

(54) SEMICONDUCTOR PACKAGE WITH DUMMY PADS

(71) Applicant: Samsung Electronics Co., Ltd., Suwon-si (KR)

(72) Inventors: Gwangjae Jeon, Suwon-si (KR); Minki Kim, Suwon-si (KR); Hyungchul Shin, Suwon-si (KR); Won Il Lee, Suwon-si (KR); Hyuekjae Lee, Suwon-si (KR); Enbin Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 318 days.

(21) Appl. No.: 18/234,529

(22) Filed: Aug. 16, 2023

(65) Prior Publication Data

US 2024/0136311 A1 Apr. 25, 2024
US 2024/0234349 A9 Jul. 11, 2024

(30) Foreign Application Priority Data

Oct. 24, 2022 (KR) ........................ 10-2022-0137640

(51) Int. Cl.

*H10W 20/20* (2026.01)
*H10W 72/90* (2026.01)
*H10W 90/00* (2026.01)

(52) U.S. Cl.

CPC .......... *H10W 20/20* (2026.01); *H10W 72/926* (2026.01); *H10W 72/934* (2026.01);
(Continued)

(58) Field of Classification Search

CPC ......... H01L 24/06; H01L 24/05; H01L 24/08; H01L 2224/0603; H01L 2224/06051;
(Continued)

(56) References Cited

U.S. PATENT DOCUMENTS 8,847,296 B2 9/2014 Tsukimura et al.
11,222,873 B2 1/2022 Jun et al.
(Continued)

FOREIGN PATENT DOCUMENTS

KR 102205746 B1 1/2021
KR 20210017369 A 2/2021
(Continued)

*Primary Examiner* — Mamadou L Diallo
(74) *Attorney, Agent, or Firm* — Muir Patent Law, PLLC

(57) ABSTRACT

Disclosed is a semiconductor package comprising lower and upper structure. The lower structure includes a first semiconductor substrate, first through vias vertically penetrating the first semiconductor substrate, first signal pads connected to the first through vias, first dummy pads between the first signal pads and electrically separated from the first through vias, and a first dielectric layer surrounding the first signal pads and the first dummy pads. The upper structure includes a second semiconductor substrate, second signal pads and second dummy pads, and a second dielectric layer surrounding the second signal pads and the second dummy pads. The first signal pad is in contact with one of the second signal pads. The first dummy pad is in contact with one of the second dummy pads. A first interval between the first dummy pads is 0.5 to 1.5 times a second interval between the first signal pads.

19 Claims, 14 Drawing Sheets

(52) U.S. Cl.
CPC ........ *H10W 72/936* (2026.01); *H10W 72/967* (2026.01); *H10W 90/792* (2026.01)

(58) Field of Classification Search
CPC ........... H01L 2224/06515; H01L 24/80; H01L 2224/08146; H01L 23/481; H01L 2224/05557; H01L 2224/08145; H01L 23/49827; H01L 23/49838; H01L 23/5384; H01L 23/5386; H01L 24/07; H01L 24/04; H01L 25/0657; H01L 2224/0605; H01L 2224/0614; H01L 2224/08123
See application file for complete search history.

(56) References Cited

U.S. PATENT DOCUMENTS 11,233,088 B2 * 1/2022 Chen ..................... H10F 39/809
11,309,243 B2 4/2022 Chen et al.
11,456,263 B2 * 9/2022 Wei ......................... H01L 24/08
2021/0043673 A1 2/2021 Kwon et al.
2021/0175191 A1 6/2021 Huang et al.
2021/0183801 A1 6/2021 Jang et al.
2021/0183816 A1 * 6/2021 Jun ..................... H01L 25/0657
2021/0280545 A1 * 9/2021 Watanabe ............... H01L 24/09
2022/0028804 A1 * 1/2022 Mitsuhashi ............. H01L 24/06
2022/0028833 A1 * 1/2022 Okubo .................... H01L 25/50
2022/0223565 A1 * 7/2022 Chen ....................... H01L 24/80
2022/0415572 A1 * 12/2022 Park .................... H01L 23/5223
2022/0415784 A1 * 12/2022 Chuang ................... H01L 24/08
2023/0038603 A1 * 2/2023 Choi ....................... H01L 22/32
2023/0050652 A1 * 2/2023 Moon ..................... H01L 24/80
2023/0307387 A1 * 9/2023 Kawanishi ............. H10B 43/40
2023/0378134 A1 * 11/2023 Lee ......................... H01L 25/18
2024/0021488 A1 * 1/2024 Sun ..................... H01L 25/0657
2024/0021544 A1 * 1/2024 Hu .......................... H01L 24/33
2024/0153899 A1 * 5/2024 Chen ................. H01L 23/49503

FOREIGN PATENT DOCUMENTS

KR 20210073809 A 6/2021
KR 20220127671 A 9/2022

* cited by examiner

FIG. 4
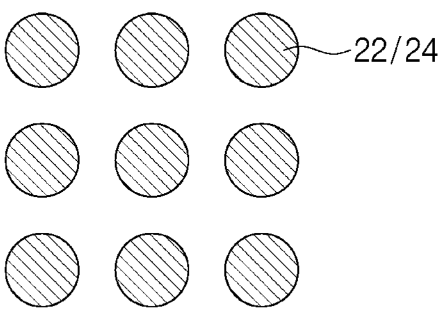
FIG. 5
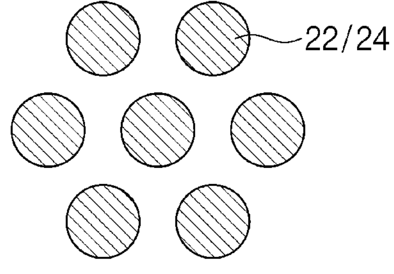
FIG. 6
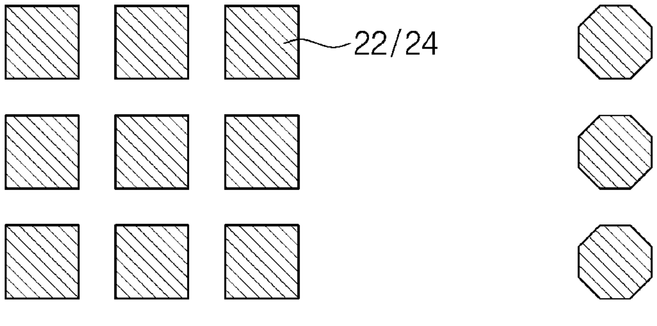
FIG. 7
22/24

SEMICONDUCTOR PACKAGE WITH DUMMY PADS

CROSS-REFERENCE TO RELATED APPLICATION

This U.S. nonprovisional application claims priority under 35 U.S.C § 119 to Korean Patent Application No. 10-2022-0137640, filed on Oct. 24, 2022 in the Korean Intellectual Property Office, the disclosure of which is hereby incorporated by reference in its entirety.

BACKGROUND

Aspects of the present inventive concept relate to a semiconductor package, and more particularly, to a directly bonded semiconductor package and a method of fabricating the same.

In the semiconductor industry, high capacity, thinness, and small size of semiconductor devices and electronic products using the same have been demanded and thus various package techniques have been suggested. One approach of the various package techniques is a packaging technique which vertically stacks a plurality of semiconductor chips to achieve a high-density chip stack. This packaging technique has an advantage capable of integrating semiconductor chips having various functions on a small area than a conventional package consisting of one semiconductor chip.

A semiconductor package is provided to implement an integrated circuit chip to be suitable for use in electronic products. A semiconductor package is typically configured such that a semiconductor chip is mounted on a printed circuit board and bonding wires or bumps are used to electrically connect the semiconductor chip to the printed circuit board. With the development of electronic industry, various researches have been conducted to improve reliability and durability of semiconductor packages.

SUMMARY

Some embodiments of the present inventive concept provide a semiconductor package with increased structural stability and a method of fabricating the same.

Some embodiments of the present inventive concept provide a semiconductor package with good electrical connection between semiconductor chips and a method of fabricating the same.

According to some embodiments of the present inventive concept, a semiconductor package may comprise: a lower structure; and an upper structure on the lower structure. The lower structure may include: a first semiconductor substrate; first through vias that vertically penetrate the first semiconductor substrate; first signal pads on the first semiconductor substrate, wherein the first signal pads are connected to the first through vias; first dummy pads on the first semiconductor substrate, wherein the first dummy pads are between the first signal pads, and the first dummy pads are electrically separated from the first through vias; and a first dielectric layer on the first semiconductor substrate, wherein the first dielectric layer surrounding the first signal pads and the first dummy pads. The upper structure may include: a second semiconductor substrate; second signal pads and second dummy pads on the second semiconductor substrate; and a second dielectric layer on the second semiconductor substrate, wherein the second dielectric layer surrounds the second signal pads and the second dummy pads. Each of the first signal pads may be in contact with one of the second signal pads. Each of the first dummy pads may be in contact with one of the second dummy pads. A first interval between the first dummy pads may be about 0.5 times to about 1.5 times a second interval between the first signal pads.

According to some embodiments of the present inventive concept, a semiconductor package may comprise: a lower structure; and an upper structure on the lower structure. The lower structure may include: a first semiconductor substrate that has a first region and a second region on one side of the first region; first through vias on the first region, wherein the first through vias vertically penetrate the first semiconductor substrate; first signal pads on the first region, wherein the first signal pads are on the first semiconductor substrate and connected to the first through vias; first dummy pads on the second region, wherein the first dummy pads are on the first semiconductor substrate and electrically floated from the first through vias; and a first dielectric layer on the first semiconductor substrate, wherein the first dielectric layer surrounds the first signal pads and the first dummy pads. The upper structure may include: a second semiconductor substrate; second signal pads on the second semiconductor substrate; and a second dielectric layer on the second semiconductor substrate, wherein the second dielectric layer surrounds the second signal pads. The first dielectric layer and the second dielectric layer may be in contact with each other. Each of the first signal pads and a corresponding one of the second signal pads may constitute a single unitary body formed of the same material. An arrangement period of the first dummy pads may be about 0.5 times to about 1.5 times an arrangement period of the first signal pads.

According to some embodiments of the present inventive concept, a semiconductor package may comprise: a substrate; semiconductor dies stacked on the substrate; and a molding layer on the substrate, wherein the molding layer surrounds the dies. Each of the dies may include: a semiconductor substrate having a device region and a scribe lane region that surrounds the device region; first signal pads on the device region, wherein the first signal pads are on an inactive surface of the semiconductor substrate; first dummy pads on the device region, wherein the first dummy pads are on the inactive surface of the semiconductor substrate, and the first dummy pads are between the first signal pads; second dummy pads on the scribe lane region, wherein the second dummy pads are on the inactive surface of the semiconductor substrate; and through vias that vertically penetrate the semiconductor substrate, wherein the through vias are connected to the first signal pads. The dies vertically adjacent to each other may be in contact with and bonded to each other. Top surfaces of the first signal pads may be flat. At least one of the second dummy pads may have a concave portion recessed toward the semiconductor substrate.

BRIEF DESCRIPTION OF THE DRAWINGS

FIGS. 4-7 illustrate plan views showing an arrangement and shape of pads.

DETAIL DESCRIPTION OF EMBODIMENTS

The following will now describe a semiconductor package according to aspects of the present inventive concept with reference to the accompanying drawings.

Figure 1:
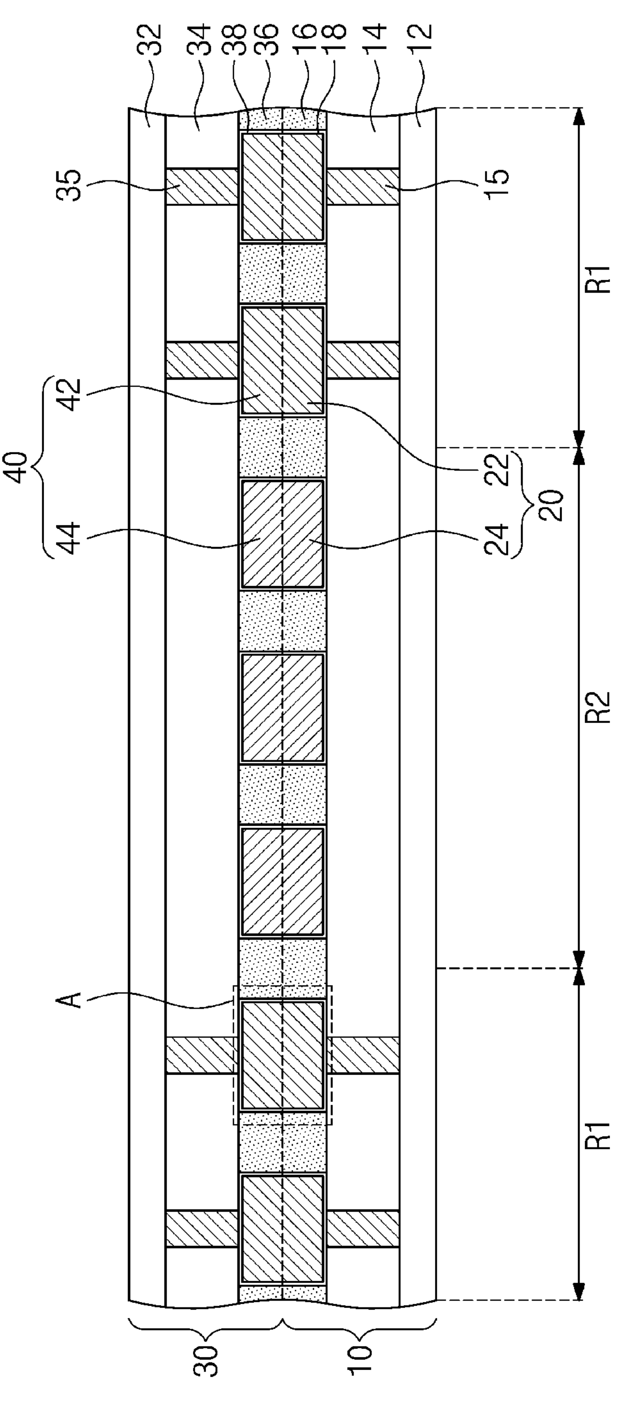
FIG. 1 illustrates a cross-sectional view showing a semiconductor package according to some embodiments of the present inventive concept.
Figure 2:
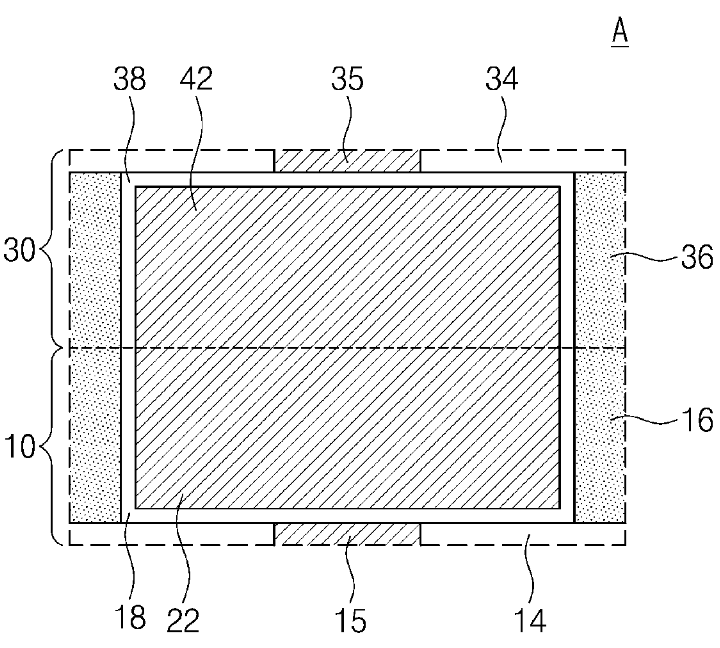
FIG. 2 illustrates an enlarged view showing section A of FIG. 1.
Figure 3:
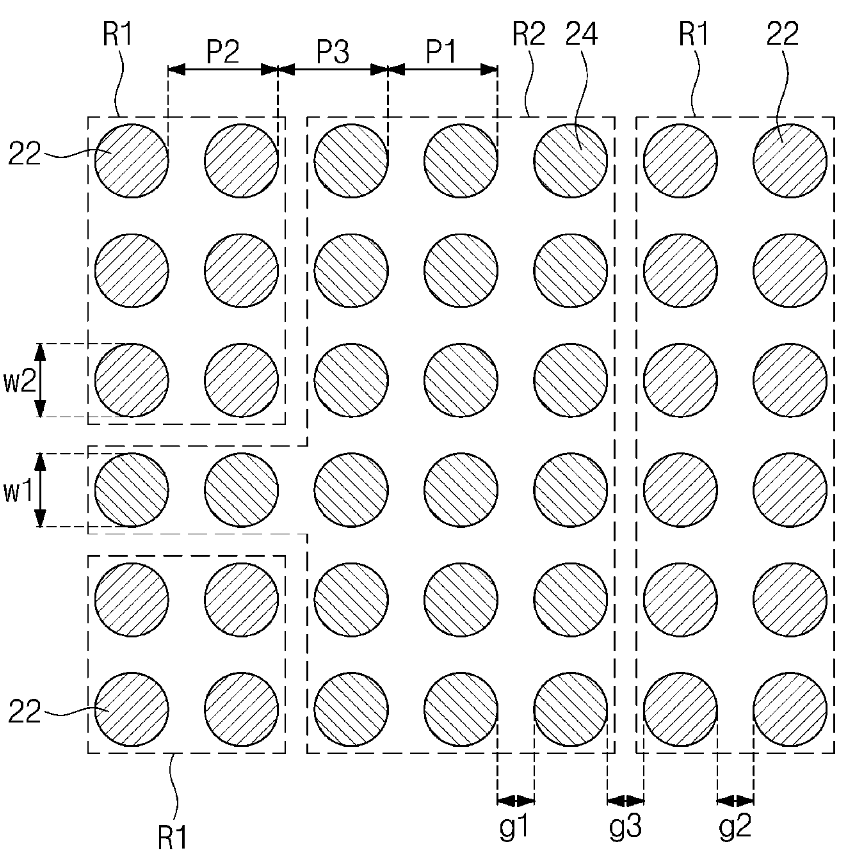
FIG. 3 illustrates a plan view showing an arrangement of pads.

FIG. 1 illustrates a cross-sectional view showing a semiconductor package according to some embodiments of the present inventive concepts. FIG. 2 illustrates an enlarged view showing section A of FIG. 1. FIG. 3 illustrates a plan view showing an arrangement of pads. FIGS. 4-7 illustrate plan views showing an arrangement and shape of pads.

Referring to FIGS. 1 and 2, a semiconductor device may include a lower structure 10 and an upper structure 30 stacked on the lower structure 10.

The lower structure 10 may include a first substrate 12, a first circuit layer 14, a first dielectric layer 16, and first pads 20.

The first substrate 12 extending in a first direction and a second direction, perpendicular to the first direction, may be provided. The first substrate 12 may be a semiconductor substrate, such as a semiconductor wafer. The first substrate 12 may be a bulk silicon substrate, a silicon-on-insulator (SOI) substrate, a germanium substrate, a germanium-on-insulator (GOI) substrate, a silicon-germanium (SiGe) substrate, or an epitaxial film substrate obtained by performing a selective epitaxial growth (SEG). The first substrate 12 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the first substrate 12 may be a dielectric substrate, such as a printed circuit board (PCB). The first substrate 12 may have first regions R1 and a second region R2 disposed between the first regions R1.

The first circuit layer 14 may be provided on the first substrate 12. The first circuit layer 14 may be disposed on a top surface of the first substrate 12. The first circuit layer 14 may include a first circuit pattern provided on the first substrate 12 and a first interlayer dielectric layer that covers the first circuit pattern. The first circuit pattern may be a memory circuit, a logic circuit, or a combination thereof, any of which circuits includes one or more transistors. Alternatively, the first circuit pattern may include a passive element, such as a resistor, an inductor, or a capacitor.

Referring together to FIGS. 1, 2, and 3, the first pads 20 may be provided on the first circuit layer 14. The first pads 20 may be disposed on a top surface of the first circuit layer 14. The first pads 20 may include first signal pads 22 and first dummy pads 24. The first signal pads 22 may be provided on the first regions R1 of the first substrate 12. The first signal pads 22 may be pads electrically connected to the first circuit pattern of the first circuit layer 14. The first dummy pads 24 may be disposed on the second region R2 of the first substrate 12. The first dummy pads 24 may be electrically floating pads in the lower structure 10. The first dummy pads 24 may not be electrically connected to the first circuit pattern of the first circuit layer 14. For example, the first regions R1 may be defined as areas where the first signals pads 22 are provided for transferring electrical signals of the lower structure 10, and the second region R2 may correspond to a remaining area where the first signal pads 22 are not provided. FIGS. 1, 2, and 3 depict that one second region R2 is provided, but aspects of the present inventive concept are not limited thereto. In addition, FIG. 3 depicts, by way of example, arrangements and shapes of the first regions R1 and the second region R2, but aspects of the present inventive concept are not limited thereto. On the first substrate 12, the number of the first signal pads 22 provided in the lower structure 10 may be about 10 times to about 100 times the number of the first dummy pads 24 provided in the lower structure 10. Terms such as "uniform," "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first pads 20 may each have a thickness that is substantially uniform. For example, the first pads 20 may each have a plate shape. According to some embodiments, the first pads 20 may each have a T-shaped cross-section including a via part and its overlying pad part that are integrally connected into a single unitary body. The first pads 20 may have their widths each of which is constant irrespective of distance from the first substrate 12. Alternatively, differently from that shown in FIG. 1, the first pads 20 may have their widths each of which decreases with decreasing distance from the first substrate 12. The first dummy pads 24 may each have a first width w1 that is about 0.8 times to about 1.2 times a second width w2 of each of the first signal pads 22. As an example, the first width w1 and the second width w2 may be substantially the same as each other. A first interval g1 between the first dummy pads 24 may be about 0.5 times to about 1.5 times a second interval g2 between the first signal pads 22. As an example, the first interval g1 and the second interval g2 may be substantially the same as each other. A third interval g3 between the first dummy pad 24 and the first signal pad 22 that are adjacent to each other among the first dummy pads 24 and the first signal pads 22 may be about 0.5 times to about 1.5 times the second interval g2 between the first signal pads 22. As an example, the third interval g3 and the second interval g2 may be substantially the same as each other. The first pads 20, or the first signal pads 22 and the first dummy pads 24, may be arranged in a square fashion (i.e., pattern) as shown in FIG. 4 or in a honeycomb fashion as shown in FIG. 5. Aspects of the present inventive concept, however, are not limited thereto. A first arrangement period p1 of the first dummy pads 24 may be about 0.5 times to about 1.5 times a second arrangement period p2 of the first signal pads 22.

As an example, the first arrangement period p1 and the second arrangement period p2 may be substantially the same as each other. A third arrangement period p3 of the first dummy pad 24 and the first signal pad 22 that are adjacent to each other among the first dummy pads 24 and the first signal pads 22 may be about 0.5 times to about 1.5 times the second arrangement period p2 of the first signal pads 22. As an example, the third arrangement period p3 and the second arrangement period p2 may be substantially the same as each other. The first pads 20 may each have a circular planar shape as shown in FIG. 4. Alternatively, the first pads 20 may each have a tetragonal planar shape as shown in FIG. 6, an octagonal planar shape as shown in FIG. 7, or any other polygonal planar shape. Aspects of the present inventive concept, however, are not limited thereto, and the planar shape of the first pad 20 may be variously changed if necessary. The first pads 20 may include a metallic material. For example, the first pads 20 may include copper (Cu).

The first signal pads 22 may be electrically connected to the first circuit pattern of the first circuit layer 14. For example, as shown in FIG. 1, a first connection line 15 may be provided in the first circuit layer 14. The first connection line 15 may be a through via that vertically (i.e., in a third direction perpendicular to the first direction and the second direction) penetrates the first interlayer dielectric layer provided in the first circuit layer 14 on the first regions R1. The first connection line 15 may vertically extend in the first circuit layer 14 to be coupled to the first signal pads 22. The first connection line 15 may electrically connect the first circuit pattern to the first signal pads 22. The first connection line 15 may not be provided on the second region R2. The first connection line 15 may not be coupled to the first dummy pads 24. Although not shown in FIG. 1, various conductive patterns may be provided for connection between the first circuit pattern and the first connection line 15. Differently from that shown in FIG. 1, the first connection line 15 may be an under-pad pattern or a redistribution pattern provided in a dielectric pattern of the first circuit layer 14. In this case, various conductive patterns may be provided for connection between the first circuit pattern and the first connection line 15. Aspects of the present inventive concept, however, are not limited thereto, and the first circuit layer 14 may be provided in various shapes if necessary, and an electrical connection between the first signal pads 22 and the first circuit layer 14 may be achieved through configurations that are variously changed as needed.

The first dielectric layer 16 may be disposed on the first circuit layer 14. On the top surface of the first circuit layer 14, the first dielectric layer 16 may surround the first pads 20. The first pads 20 may have top surfaces that are exposed by the first dielectric layer 16. For example, when viewed in a plan view, the first dielectric layer 16 may surround, but may not cover, the first pads 20. The first dielectric layer 16 and the first signal pads 22 may have top surfaces that are substantially flat and coplanar with each other. The first dielectric layer 16 and the first dummy pads 24 may have top surfaces that are substantially flat and coplanar with each other. Aspects of the present inventive concept, however, are not limited thereto. The top surface of at least one of the first dummy pads 24 may have a concave portion that is recessed toward (i.e., in the third direction) the first substrate 12 from the top surface of the first dielectric layer 16. In this case, the first dummy pad 24 having the concave portion may be one of the first dummy pads 24 that is farthest away from the first signal pads 22. The first dielectric layer 16 may include oxide, nitride, or oxynitride of a material included in the first substrate 12 or the first circuit layer 14. The first dielectric layer 16 may include a dielectric material, such as silicon oxide (SiO), silicon nitride (SiN), silicon oxynitride (SiON), or silicon carbonitride (SiCN). For example, the first dielectric layer 16 may include silicon oxide (SiO).

The first pad 20 may have their damascene structures in the first dielectric layer 16. For example, each of the first pads 20 may further include a first seed/barrier pattern 18 that covers lateral and bottom surfaces of the first pad 20. The first seed/barrier patterns 18 may conformally cover the lateral and bottom surfaces of the first pads 20. The first seed/barrier patterns 18 may be interposed between the first pads 20 and the first dielectric layer 16 and between the first pads 20 and the first circuit layer 14. When the first seed/barrier patterns 18 are used as seed patterns, the first seed/barrier patterns 18 may include metal, such as gold (Au). When the first seed/barrier patterns 18 are used as barrier patterns, the first seed/barrier patterns 18 may include either metal such as titanium (Ti) and tantalum (Ta), or metal nitride such as titanium nitride (TiN) and tantalum nitride (TaN).

Referring still to FIGS. 1 and 2, the upper structure 30 may be provided on the lower structure 10. The upper structure 30 may include a second substrate 32, a second circuit layer 34, a second dielectric layer 36, and second pads 40.

The second substrate 32 extending in the first direction and the second direction may be provided. The second substrate 32 may be a semiconductor substrate, such as a semiconductor wafer. The second substrate 32 may be a bulk silicon substrate, a silicon-on-insulator (SOI) substrate, a germanium substrate, a germanium-on-insulator (GOI) substrate, a silicon-germanium (SiGe) substrate, or an epitaxial film substrate obtained by performing a selective epitaxial growth (SEG). The second substrate 32 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the second substrate 32 may be a dielectric substrate, such as a printed circuit board (PCB).

The second circuit layer 34 may be provided on the second substrate 32. The second circuit layer 34 may be disposed on a bottom surface of the second substrate 32. The second circuit layer 34 may include a second circuit pattern provided on the second substrate 32 and a second interlayer dielectric layer that covers the second circuit pattern. The second circuit pattern may be a memory circuit, a logic circuit, or a combination thereof, any of which circuits includes one or more transistors. Alternatively, the second circuit pattern may include a passive element, such as a resistor, an inductor, or a capacitor.

The second pads 40 may be disposed on the second circuit layer 34. The second pads 40 may be disposed on a bottom surface of the second circuit layer 34. The second pads 40 may include second signal pads 42 and second dummy pads 44. The second signal pads 42 may be provided on the first regions R1 of the second substrate 32. The second signal pads 42 may be pads electrically connected to the second circuit pattern of the second circuit layer 34. The second dummy pads 44 may be disposed on the second region R2 of the second substrate 32. The second dummy pads 44 may be electrically floating pads in the upper structure 30. The second dummy pads 44 may not be electrically connected to the second circuit pattern of the second circuit layer 34. On the second substrate 32, the number of the second signal pads 42 provided in the upper structure 30 may be about 10 times to about 100 times the number of the second dummy pads 44 provided in the upper structure 30.

The second pads 40 may each have a thickness that is substantially uniform. For example, the second pads 40 may have a plate shape. According to some embodiments, the second pads 40 may each have a T-shaped cross-section including a via part and its overlying pad part that are integrally connected into a single unitary body. The second pads 40 may have their widths each of which is constant irrespective of distance from the second substrate 32. Alternatively, the second pads 40 may have their widths each of which decreases with decreasing distance from the second substrate 32. The second dummy pads 44 may each have a width that is about 0.8 times to about 1.2 times, or the same as, a width of each of the second signal pads 42. An interval between the second dummy pads 44 may be about 0.5 times to about 1.5 times, or the same as, an interval between the second signal pads 42. An interval between the second dummy pads 44 and the second signal pad 42 that are adjacent to each other among the second dummy pads 44 and the second signal pads 42 may be about 0.5 times to about 1.5 times, or the same as, an interval between the second signal pads 42. The second signal pads 42 and the second dummy pads 44 may be arranged in a square or honeycomb fashion. The second pads 40 may each have a circular, tetragonal, octagonal, or polygonal planar shape. The second pads 40 may include a metallic material. For example, the second pads 40 may include copper (Cu).

The second signal pads 42 may be electrically connected to the second circuit pattern of the second circuit layer 34. For example, as shown in FIG. 1, a second connection line 35 may be provided in the second circuit layer 34. The second connection line 35 may be a through via that vertically penetrates the second interlayer dielectric layer provided in the second circuit layer 34 on the first regions R1. The second connection line 35 may vertically extend in the second circuit layer 34 to be coupled to the second signal pads 42. The second connection line 35 may electrically connect the second circuit pattern to the second signal pads 42. The second connection line 35 may not be provided on the second region R2. The second connection line 35 may not be coupled to the second dummy pads 44. Although not shown in FIG. 1, various conductive patterns may be provided for connection between the second circuit pattern and the second connection line 35. Differently from that shown in FIG. 1, the second connection line 35 may be an under-pad pattern or a redistribution pattern provided in a dielectric pattern in the second circuit layer 34. In this case, various conductive patterns may be provided for connection between the second circuit pattern and the second connection line 35. Aspects of the present inventive concept, however, are not limited thereto, and the second circuit layer 34 may be provided in various shapes if necessary, and an electrical connection between the second signal pads 42 and the second circuit layer 34 may be achieved through configurations that are variously changed as needed.

The second dielectric layer 36 may be disposed on the second circuit layer 34. On the bottom surface of the second circuit layer 34, the second dielectric layer 36 may surround the second pads 40. The second pads 40 may have bottom surfaces that are exposed (i.e., not covered) by the second dielectric layer 36. For example, when viewed in a plan view, the second dielectric layer 36 may surround, but may not cover, the second pads 40. The second dielectric layer 36 and the second signal pads 42 may have their bottom surfaces that are substantially flat and coplanar with each other. The second dielectric layer 36 and the second dummy pads 44 may have their bottom surfaces that are substantially flat and coplanar with each other. Aspects of the present inventive concept, however, are not limited thereto. The bottom surface of at least one of the second dummy pads 44 may have a concave portion that is recessed toward the second substrate 32 from the bottom surface of the second dielectric layer 36. In this case, the second dummy pad 44 having the concave portion may be one of the second dummy pads 44 that is farthest away from the second signal pads 42. The second dielectric layer 36 may include oxide, nitride, or oxynitride of a material included in the second substrate 32 or the second circuit layer 34. The second dielectric layer 36 may include a dielectric material, such as silicon oxide (SiO), silicon nitride (SiN), silicon oxynitride (SiON), or silicon carbonitride (SiCN). For example, the second dielectric layer 36 may include silicon oxide (SiO).

The second pads 40 may have their damascene structures in the second dielectric layer 36. For example, the second pads 40 may further include second seed/barrier patterns 38 that cover lateral and top surfaces of the second pads 40. The second seed/barrier patterns 38 may conformally cover the lateral and top surfaces of the second pads 40. The second seed/barrier patterns 38 may be interposed between the second pads 40 and the second dielectric layer 36 and between the second pads 40 and the second circuit layer 34. When the second seed/barrier patterns 38 are used as seed patterns, the second seed/barrier patterns 38 may include metal, such as gold (Au). When the second seed/barrier patterns 38 are used as barrier patterns, the second seed/barrier patterns 38 may include either metal such as titanium (Ti) and tantalum (Ta), or metal nitride such as titanium nitride (TiN) and tantalum nitride (TaN).

The upper structure 30 may be disposed on the lower structure 10. The first pads 20 of the lower structure 10 may be vertically aligned with the second pads 40 of the upper structure 30. For example, the first signal pads 22 may be vertically aligned with the second signal pads 42, and the first dummy pads 24 may be vertically aligned with the second dummy pads 44. The lower structure 10 and the upper structure 30 may be in contact with each other. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first dielectric layer 16 of the lower structure 10 and the second dielectric layer 36 of the upper structure 30 may be bonded at an interface between the lower structure 10 and the upper structure 30. In this case, the first dielectric layer 16 and the second dielectric layer 36 may constitute a hybrid bonding of oxide, nitride, or oxynitride. In this description, the term "hybrid bonding" may denote a bonding in which two components of the same kind are merged at an interface therebetween. For example, the bonded first and second dielectric layers 16 and 36 may have a continuous configuration, and an invisible interface may be provided between the first dielectric layer 16 and the second dielectric layer 36. The first dielectric layer 16 and the second dielectric layer 36 may be formed of the same material, and thus no interface may be present between the first dielectric layer 16 and the second dielectric layer 36. Thus, the first dielectric layer 16 and the second dielectric layer 36 may be provided as one component. For example, the first dielectric layer 16 and the second dielectric layer 36 may be combined to form a single unitary body. Aspects of the present inventive concept, however, are not limited thereto. The first dielectric layer 16 and the second dielectric layer 36 may be formed of different materials from each other. The first dielectric layer 16 and the second dielectric layer 36 may not have a continuous configuration, and a visible interface may be provided between the first dielectric layer 16 and the second dielectric layer 36. The first dielectric layer 16 and the second dielectric layer 36 may not be coupled to each other, and may each be provided in an individual component. The following description will focus on the embodiment of FIGS. 1 and 2.

The upper structure 30 may be connected to the lower structure 10. For example, the lower structure 10 and the upper structure 30 may be in contact with each other. The first signal pads 22 of the lower structure 10 may be electrically connected to the second signal pads 42 of the upper structure 30.

The upper structure 30 may be connected to the lower structure 10. For example, the lower structure 10 and the upper structure 30 may be in contact with each other. At the interface between the lower structure 10 and the upper structure 30, the first signal pads 22 of the lower structure 10 may be bonded to the second signal pads 42 of the upper structure 30, and the first dummy pads 24 of the lower structure 10 may be bonded to the second dummy pads 44 of the upper structure 30. In this configuration, the first signal pad 22 and the second signal pad 42 may constitute an intermetallic hybrid bonding therebetween. For example, the bonded first and second signal pads 22 and 42 may have a continuous configuration, and an invisible interface may be provided between the first signal pad 22 and the second signal pad 42. For example, the first signal pads 22 and the second signal pads 42 may be formed of the same material, and no interface may be present between the first signal pads 22 and the second signal pads 42. In this configuration, the first signal pad 22 and the second signal pad 42 may be provided as one component. For example, the first signal pad 22 and the second signal pad 42 may be combined to form a single unitary body. The first dummy pad 24 and the second dummy pad 44 may constitute an intermetallic hybrid bonding therebetween. For example, the bonded first and second dummy pads 24 and 44 may have a continuous configuration, and an invisible interface may be provided between the first dummy pad 24 and the second dummy pad 44. The first dummy pad 24 and the second dummy pad 44 may be combined to form a single unitary body.

In the embodiments that follow, a detailed description of technical features repetitive to those discussed above with reference to FIGS. 1-7 will be omitted, and a difference thereof will be discussed in detail. The same reference numerals may be allocated to the same components as those of the semiconductor package discussed above according to some embodiments of the present inventive concept.

Figure 8:
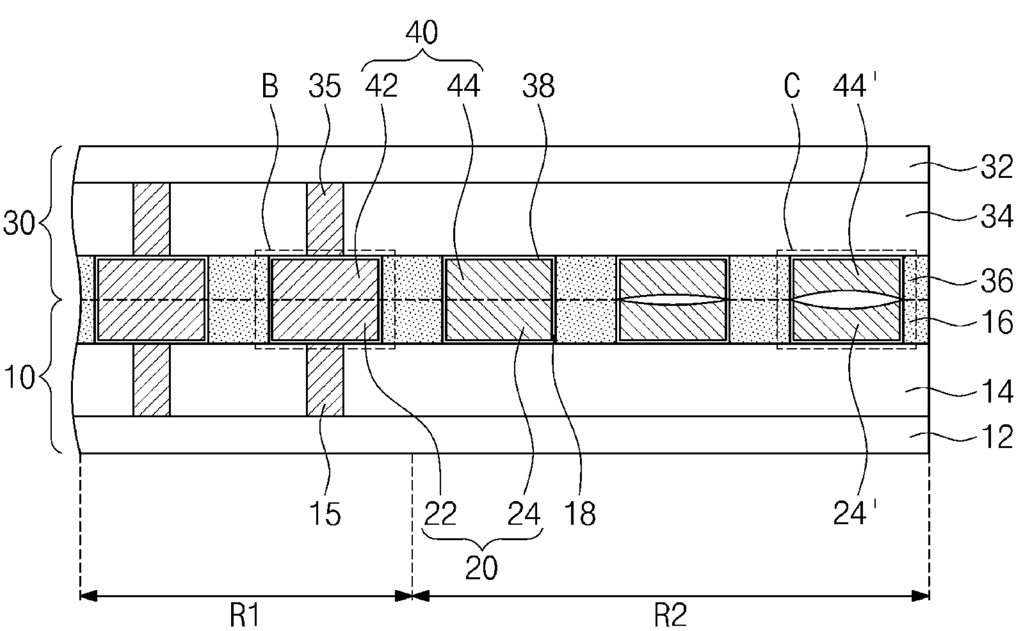
FIG. 8 illustrates a cross-sectional view showing a semiconductor package according to some embodiments of the present inventive concept.
Figure 9:
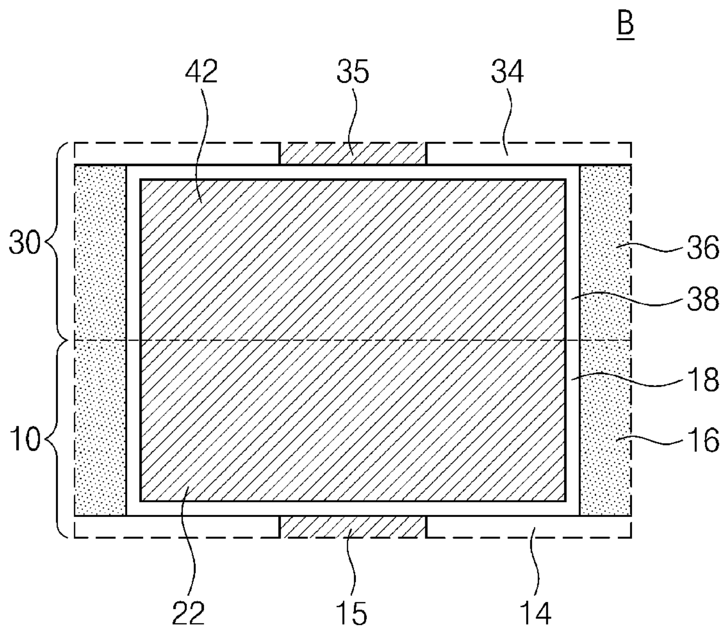
FIG. 9 illustrates an enlarged view showing section B of FIG. 8.
Figure 10:
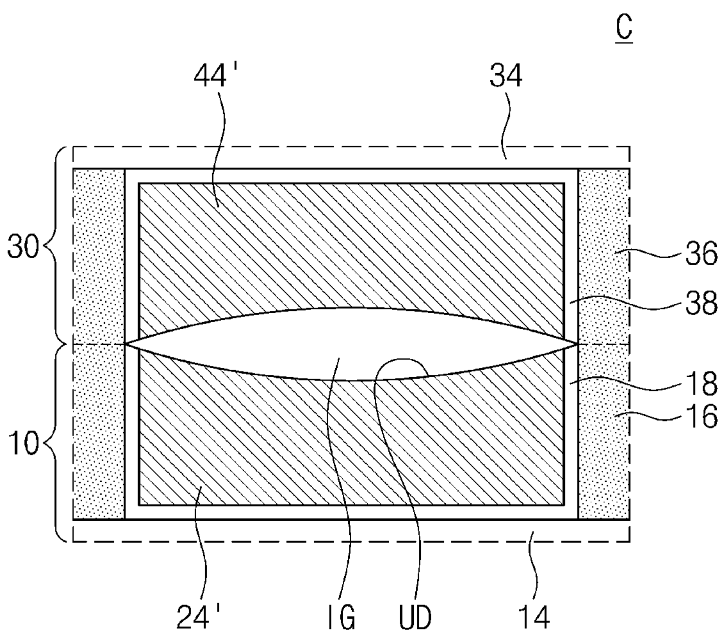
FIG. 10 illustrates an enlarged view showing section C of FIG. 8.

FIG. 8 illustrates a cross-sectional view showing a semiconductor package according to some embodiments of the present inventive concept. FIG. 9 illustrates an enlarged view showing section B of FIG. 8. FIG. 10 illustrates an enlarged view showing section C of FIG. 8.

Referring to FIGS. 8-10, a first substrate 12 of a lower structure 10 may have a first region R1 and a second region R2 on a side of the first region R1. The first region R1 may be disposed on a central portion of the first substrate 12, and the second region R2 may be disposed on an edge portion of the first substrate 12. For example, the second region R2 may be positioned between the first region R1 and a lateral surface of the first substrate 12, and when viewed in a plan view, the second region R2 may surround the first region R1. The first region R1 may be a device area where semiconductor elements are formed on the central portion of the first substrate 12, and the second region R2 may be an area where no semiconductor elements are formed on the edge region of the first substrate 12. For example, the second region R2 may be a scribe lane area along which a sawing process is performed to separate the lower structures 10 formed on a semiconductor wafer in semiconductor package fabrication process.

First pads 20 may be disposed on a first circuit layer 14. The first pads 20 may include first signal pads 22 and first dummy pads 24. The first signal pads 22 may be provided on the first region R1 of the first substrate 12. The first dummy pads 24 may be provided on the second region R2 of the first substrate 12. As the second region R2 is disposed closer than the first region R1 to the lateral surface of the first substrate 12, when viewed in a plan view, an outermost one of the first pads 20 may be one 24' of the first dummy pads 24.

The first dummy pads 24 may each have a first width that is about 0.8 times to about 1.2 times a second width of each of the first signal pads 22. A first interval between the first dummy pads 24 may be about 0.5 times to about 1.5 times a second interval between the first signal pads 22. A third interval between the first dummy pad 24 and the first signal pad 22 that are adjacent to each other among the first dummy pads 24 and the first signal pads 22 may be about 0.5 times to about 1.5 times the second interval between the first signal pads 22. A first arrangement period of the first dummy pads 24 may be about 0.5 times to about 1.5 times a second arrangement period of the first signal pads 22. A third arrangement period of the first dummy pad 24 and the first signal pad 22 that are adjacent to each other among the first dummy pads 24 and the first signal pads 22 may be about 0.5 times to about 1.5 times the second arrangement period of the first signal pads 22.

A first dielectric layer 16 may be disposed on the first circuit layer 14. On a top surface of the first circuit layer 14, the first dielectric layer 16 may surround the first pads 20. The first dielectric layer 16 and the first signal pads 22 may have top surfaces that are substantially flat and coplanar with each other. For example, the top surfaces of the first signal pads 22 may be substantially flat. At least one of the first dummy pads 24 may have on its top surface a concave portion UD that is recessed toward (i.e., in the third direction) the first substrate 12 from the top surface of the first dielectric layer 16. The top surfaces having the concave portions UD of the first dummy pads 24 may have bottom ends that are provided closer to the first substrate 12 than the top surfaces of the first signal pads 22. A reduction in distance between the first dummy pad 24 and the lateral surface of the first substrate 12 may cause an increase in depth of the concave portion UD. For example, the concave portion UD of the outermost first dummy pad 24' may be deeper than all the other concave portions UD of the first dummy pads 24. The concave portion UD may not be provided on a top surface of one of the first dummy pads 24 that is adjacent to the first region R1. Differently from that shown in FIG. 8, the concave portion UD may also be provided on a top surface of one of the first dummy pads 24 that is adjacent to the first region R1.

Second pads 40 may be disposed on a second circuit layer 34 of the upper structure 30. The second pads 40 may include second signal pads 42 and second dummy pads 44. The second signal pads 42 may be provided on the first region R1 of a second substrate 32. The second dummy pads 44 may be provided on the second region R2 of the second substrate 32. As the second region R2 is disposed closer than the first region R1 to the lateral surface of the first substrate 12, when viewed in a plan view, an outermost one of the second pads 40 may be one 44' of the second dummy pads 44.

The second dummy pads 44 may each have a width that is about 0.8 times to about 1.2 times a width of each of the second signal pads 42. An interval between the second dummy pads 44 may be about 0.5 times to about 1.5 times an interval between the second signal pads 42. An interval between the second dummy pad 44 and the second signal pad 42 that are adjacent to each other among the second dummy pads 44 and the second signal pads 42 may be about 0.5 times to about 1.5 times the interval between the second signal pads 42. An arrangement period of the second dummy pads 44 may be about 0.5 times to about 1.5 times an arrangement period of the second signal pads 42. An arrangement period of the second dummy pad 44 and the second signal pad 42 that are adjacent to each other among the second dummy pads 44 and the second signal pads 42 may be about 0.5 times to about 1.5 times the arrangement period of the second signal pads 42.

A second dielectric layer 36 may be disposed on the second circuit layer 34. On a bottom surface of the second circuit layer 34, the second dielectric layer 36 may surround the second pads 40. The second dielectric layer 36 and the second signal pads 42 may have bottom surfaces that are substantially flat and coplanar with each other. For example, the bottom surfaces of the second signal pads 42 may be substantially flat. At least one of the second dummy pads 44 may have on its bottom surface a concave portion that is recessed toward the second substrate 32 from the bottom surface of the second dielectric layer 36. The bottom surfaces having the concave portions of the second dummy pads 44 may have top ends that are provided closer to the second substrate 32 than the bottom surfaces of the second signal pads 42. A reduction in distance between the second dummy pad 44 and the lateral surface of the second substrate 32 may cause an increase in depth of the concave portion UD of the second dummy pad 44. For example, the concave portion of the outermost second dummy pad 44' may be deeper than all the other concave portions of the second dummy pads 44. No concave portion may be provided on a bottom surface of one of the second dummy pads 44 that is adjacent to the first region R1. Differently from that shown in FIG. 8, the concave portion may also be provided on a bottom surface of one of the second dummy pads 44 that is adjacent to the first region R1.

The upper structure 30 may be connected to the lower structure 10. For example, the lower structure 10 and the upper structure 30 may be in contact with each other. The first signal pads 22 of the lower structure 10 may be electrically connected to the second signal pads 42 of the upper structure 30. The first signal pads 22 of the lower structure 10 and the second signal pads 42 of the upper structure 30 may be bonded at an interface between the lower structure 10 and the upper structure 30. In this configuration, the first signal pad 22 and the second signal pad 42 may constitute an intermetallic hybrid bonding therebetween. The first dummy pads 24 of the lower structure 10 and the second dummy pads 44 of the upper structure 30 may be bonded at the interface between the lower structure 10 and the upper structure 30. A gap IG may be present between the first dummy pad 24 having the concave portion UD and the second dummy pad 44 having the concave portion.

Figure 11:
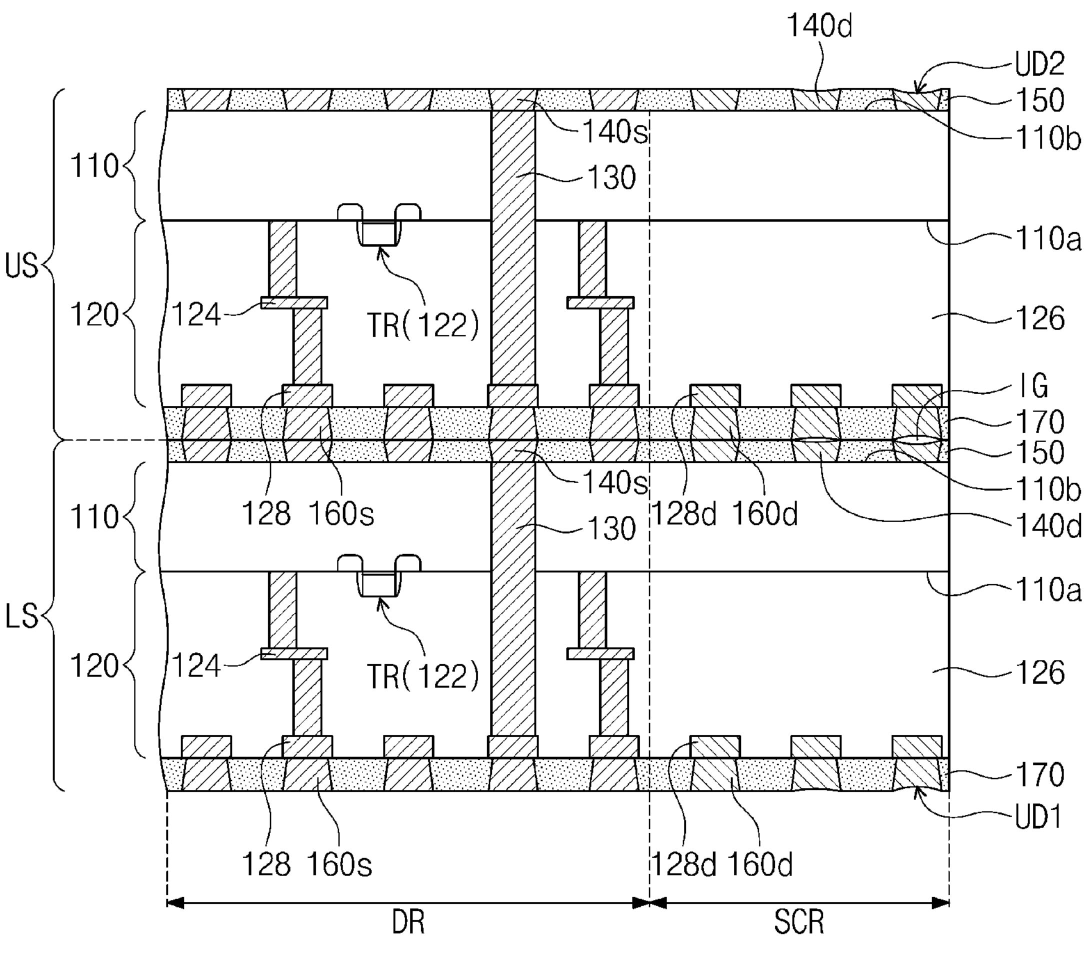
FIGS. 11-14 illustrate cross-sectional views showing a semiconductor package according to some embodiments of the present inventive concept.

FIG. 11 illustrates a cross-sectional view showing a semiconductor package according to some embodiments of the present inventive concept.

Referring to FIG. 11, a lower structure LS and an upper structure US may include a semiconductor substrate 110, a circuit layer 120, a via 130, upper pads **140*s* and 140*d*, an upper protection layer 150, lower pads 160*s* and 160*d*, and a lower protection layer 170. For example, each of the lower and upper structures LS and US may correspond to one semiconductor die. The lower structure LS and the upper structure US may correspond to the lower structure 10 and the upper structure 30 discussed with reference to FIGS. 1-10**.

The semiconductor substrate 110 extending in the first direction and the second direction may be provided. The semiconductor substrate 110 may correspond to the first substrate 12 discussed with reference to FIGS. 1-10. The semiconductor substrate 110 may have a device region DR and a scribe lane region SCR. The device region DR may be an area on which are provided a semiconductor element and an electronic circuit in the lower structure LS. The scribe lane region SCR may be an area along which a sawing process is performed to separate semiconductor packages formed on a semiconductor wafer in semiconductor package fabrication process, which area may be a remaining portion of the first substrate (see 12 of FIG. 1) where any of the semiconductor element and the electronic circuit is not provided. When viewed in a plan view, the device region DR may be positioned on a central portion of the semiconductor substrate 110, and the scribe lane region SCR may surround the device region DR. The semiconductor substrate 110 may have a front surface **110*a* and a rear surface 110*b* that are opposite to each other. In this description, the front surface 110*a* of the semiconductor substrate 110 may be defined to refer to a surface on which semiconductor elements are mounted or interconnection lines and pads are formed, and the rear surface 110*b* of the semiconductor substrate 110** may be defined to refer to a surface opposite to the front surface.

The circuit layer 120 may include a semiconductor element 122 and a device wiring part 124. The circuit layer 120 may correspond to the first circuit layer 14 discussed with reference to FIGS. 1-10.

The semiconductor element 122 may include at least one transistor TR provided on the front surface **110*a* of the semiconductor substrate 110. For example, the transistor TR may include a source and a drain that are formed on a lower portion of the semiconductor substrate 110, a gate electrode disposed on the first surface 110*a* of the semiconductor substrate 110, and a gate dielectric layer interposed between the semiconductor substrate 110 and the gate electrode. The semiconductor element 122 may include a memory circuit. Although not shown, the semiconductor element 122 may include a shallow device isolation pattern, a logic cell, or a plurality of memory cells on the first surface 110*a* of the semiconductor substrate 110. Alternatively, the semiconductor element 122** may include a passive element such as a capacitor.

The front surface **110*a* of the semiconductor substrate 110 may be covered with a device interlayer dielectric layer 126. The device interlayer dielectric layer 126 may bury the semiconductor element 122. The device interlayer dielectric layer 126 may include, for example, at least one selected from silicon oxide (SiO), silicon nitride (SiN), and silicon oxynitride (SiON). Alternatively, the device interlayer dielectric layer 126 may include a low-k dielectric material. The device interlayer dielectric layer 126 may have a mono-layered structure or a multi-layered structure. When the device interlayer dielectric layer 126** is provided in the form of the multi-layered structure, subsequently described wiring layers may be provided in each dielectric layer, and an etch stop layer may be interposed between the dielectric layers. For example, the etch stop layer may be provided on a bottom surface of each dielectric layer. The etch stop layer may include, for example, one of silicon nitride (SiN), silicon oxynitride (SiON), and silicon carbonitride (SiCN).

The device interlayer dielectric layer 126 may be provided therein with the device wiring part 124 connected to the transistor TR. The device wiring part 124 may include wiring patterns for horizontal connection and connection contacts for vertical connection.

The wiring patterns may be positioned between top and bottom surfaces of the device interlayer dielectric layer 126. FIG. 11 depicts that a portion of the wiring patterns is provided in the form of one wiring layer between the semiconductor substrate 110 and the bottom surface of the device interlayer dielectric layer 126, but aspects of the present inventive concept are not limited thereto. According to some embodiments, another portion of the wiring patterns may be provided in the form of a plurality of wiring layers.

A portion 128 (or an under-pad pattern) of the wiring patterns may be exposed on the bottom surface of the device interlayer dielectric layer 126. For example, the under-pad pattern 128 may be a wiring pattern provided at bottom of the device wiring part 124 provided in the device interlayer dielectric layer 126. The under-pad pattern 128 may be disposed on the device region DR to be connected to the semiconductor element 122. The under-pad pattern 128 may include a portion **128*d* (referred to hereinafter as a dummy wiring pattern) disposed on the scribe lane region SCR. The dummy wiring pattern 128*d* may be electrically insulated from the semiconductor element 122. For example, the dummy wiring pattern 128*d* may be electrically floated from the semiconductor element 122 and a circuit connected to the semiconductor element 122. According to some embodiments, the dummy wiring pattern 128*d*** may not be provided.

The connection contacts may connect the wiring patterns to each other, or may connect the wiring patterns to the semiconductor element 122 or the semiconductor substrate 110. For example, portions of the connection contacts may vertically penetrate the device interlayer dielectric layer 126 to be connected to ones of source electrodes, drain electrodes, and gate electrodes of the transistors TR or to various components of the semiconductor element 122. The device wiring part 124 may include, for example, tungsten (W).

Vias 130 may be disposed on the device region DR of the semiconductor substrate 110. The vias 130 may vertically penetrate the semiconductor substrate 110 and the device interlayer dielectric layer 126 to be connected to top surfaces of portions of the under-pad pattern 128. The vias 130 may vertically penetrate the device interlayer dielectric layer 126 and the semiconductor substrate 110 to be exposed on a top surface of the semiconductor substrate 110. The vias 130 may be electrically floated from the dummy wiring pattern **128*d*. The vias 130** may include, for example, tungsten (W).

Lower pads **160*s* and 160*d* may be disposed on the device interlayer dielectric layer 126. The lower pads 160*s* and 160*d* may be disposed on a bottom surface of the under-pad pattern 128 and a bottom surface of the dummy wiring pattern 128*d*. The lower pads 160*s* and 160*d* may include first signal pads 160*s* and first dummy pads 160*d*. The first signal pads 160*s* and the first dummy pads 160*d* may correspond to the second signal pads 42 and the second dummy pads 44 discussed with reference to FIG. 8. For example, shapes, sizes, and arrangements of the first signal pads 160*s* and the first dummy pads 160*d* may be substantially the same as or similar to those of the second signal pads 42 and the second dummy pads 44 discussed with reference to FIG. 8. The first signal pads 160*s* may be disposed on the device region DR. The first signal pads 160*s* may be electrically connected to the semiconductor element 122. For example, the first signal pads 160*s* may be coupled to the under-pad pattern 128, and may be connected through the circuit layer 120 to the semiconductor element 122. The first dummy pads 160*d* may be disposed on the scribe lane region SCR. The first dummy pads 160*d* do not include dummy pads in the device region. The first dummy pads 160*d* may be electrically insulated from the semiconductor element 122. At least one of the first dummy pads 160*d* may have a first concave portion UD1 on a bottom surface thereof. A reduction in distance between the first dummy pad 160*d* and a lateral surface of the semiconductor substrate 110 may cause an increase in depth of the first concave portion UD1. The lower pads (i.e., the first signal pad 160*s* and the first dummy pads 160*d*) may include a metallic material. For example, the lower pads 160*s* and 160*d*** may include copper (Cu).

A lower protection layer 170 may be disposed on the device interlayer dielectric layer 126. On the bottom surface of the device interlayer dielectric layer 126, the lower protection layer 170 may cover the device wiring part 124. The lower protection layer 170 may have a substantially flat bottom surface. On the bottom surface of the device interlayer dielectric layer 126, the lower protection layer 170 may surround the lower pads **160*s* and 160*d*. The lower pads 160*s* and 160*d* may be exposed by the lower protection layer 170. For example, the lower protection layer 170 may not cover the bottom surfaces and the top surfaces of the lower pads 160*s* and 160*d*. The lower protection layer 170 and the first signal pads 160*s* may have bottom surfaces that are substantially flat and coplanar with each other. The lower protection layer 170** may include one of silicon nitride (SiN), silicon oxide (SiO), silicon carboxide (SiOC), silicon oxynitride (SiON), and silicon carbonitride (SiCN).

Upper pads **140*s* and 140*d* may be disposed on the rear surface 110*b* of the semiconductor substrate 110. The upper pads 140*s* and 140*d* may include second signal pads 140*s* and second dummy pads 140*d*. The second signal pads 140*s* and the second dummy pads 140*d* may correspond to the first signal pads 22 and the first dummy pads 24 discussed with reference to FIG. 8. For example, shapes, sizes, and arrangements of the second signal pads 140*s* and the second dummy pads 140*d* may be substantially the same as or similar to those of the first signal pads 22 and the first dummy pads 24 discussed with reference to FIG. 8. The second signal pads 140*s* may be disposed on the device region DR. Ones of the second signal pads 140*s* may be connected to the vias 130. For example, the vias 130 may vertically penetrate the semiconductor substrate 110 to be coupled to bottom surfaces of the second signal pads 140*s*. The second dummy pads 140*d* may be disposed on the scribe lane region SCR. The second dummy pads 140*d* do not include dummy pads in the device region. The second dummy pads 140*d* may be electrically insulated from the vias 130. At least one of the second dummy pads 140*d* may have a second concave portion UD2 on a top surface thereof. A reduction in distance between the second dummy pad 140*d* and the lateral surface of the semiconductor substrate 110 may cause an increase in depth of the second concave portion UD2. The upper pads 140*s* and 140*d* may include a metallic material. For example, the upper pads 140***s* and 140*d* may include copper (Cu).

An upper protection layer 150 may be disposed on the rear surface 110*b* of the semiconductor substrate 110. The upper protection layer 150 may have a substantially flat top surface. On the semiconductor substrate 110, the upper protection layer 150 may surround the upper pads 140*s* and 140*d*. The top surfaces of the upper pads 140*s* and 140*d* may be exposed (i.e., not covered) by the upper protection layer 150. The upper protection layer 150 and the second signal pads 140*s* may have top surfaces that are substantially flat and coplanar with each other. The upper protection layer 150 may include one of silicon nitride (SiN), silicon oxide (SiO), silicon carboxide (SiOC), silicon oxynitride (SiON), and silicon carbonitride (SiCN).

The upper structure US may have a structure substantially the same as or similar to that of the lower structure LS. For example, the upper structure US may include a semiconductor substrate 110, a circuit layer 120, a via 130, upper pads 140*s* and 140*d*, an upper protection layer 150, lower pads 160*s* and 160*d*, and a lower protection layer 170. The upper structure US may correspond to one semiconductor die. The upper structure US may correspond to the upper structure 30 discussed with reference to FIGS. 1-10.

The upper structure US may be disposed on the lower structure LS. The upper pads 140*s* and 140*d* of the lower structure LS may be vertically aligned with the lower pads 160*s* and 160*d* of the upper structure US. The lower structure LS and the upper structure US may be in contact with each other.

At an interface between the lower structure LS and the upper structure US, the upper protection layer 150 of the lower structure LS may be bonded to the lower protection layer 170 of the upper structure US. In this configuration, the upper protection layer 150 of the lower structure LS and the lower protection layer 170 of the upper structure US may constitute a hybrid bonding of oxide, nitride, or oxynitride. For example, the upper protection layer 150 of the lower structure LS and the lower protection layer 170 of the upper structure US may be combined to form a single unitary body. Aspects of the present inventive concept, however, are not limited thereto. The upper protection layer 150 of the lower structure LS and the lower protection layer 170 of the upper structure US may not have a continuous configuration, and a visible interface may be provided between the upper protection layer 150 of the lower structure LS and the lower protection layer 170 of the upper structure US.

The upper structure US may be connected to the lower structure LS. For example, the upper structure US and the lower structure LS may be in contact with each other. At the interface between the upper structure US and the lower structure LS, the upper pads 140*s* and 140*d* of the lower structure LS may be bonded to the lower pads 160*s* and 160*d* of the upper structure US. The second signal pads 140*s* of the lower structure LS may be bonded to the first signal pads 160*s* of the upper structure US, and the second dummy pads 140*d* of the lower structure LS may be bonded to the first dummy pads 160*d* of the upper structure US. In this case, the upper pads 140*s* and 140*d* of the lower structure LS and the lower pads 160*s* and 160*d* of the upper structure US may constitute an intermetallic hybrid bonding. For example, the upper pads 140*s* and 140*d* of the lower structure LS and their bonded lower pads 160*s* and 160*d* of the upper structure US may have a continuous configuration, and an invisible interface may be provided between the upper pads 140*s* and 140*d* of the lower structure LS and the lower pads 160*s* and 160*d* of the upper structure US. The upper pads 140*s* and 140*d* of the lower structure LS and their bonded lower pads 160*s* and 160*d* of the upper structure US may be formed of the same material, and thus no interface may be present between the upper pads 140*s* and 140*d* of the lower structure LS and their bonded lower pads 160*s* and 160*d* of the upper structure US. For example, the upper pads 140*s* and 140*d* of the lower structure LS and their bonded lower pads 160*s* and 160*d* of the upper structure US may be combined to form single unitary bodies. When the first and second dummy pads 160*d* and 140*d* have their concave portions UD1 and UD2, the first dummy pads 160*d* and the second dummy pads 140*d* may not be bonded to each other, and one or more gaps IG may be present between the first and second dummy pads 160*d* and 140*d*.

Figure 12:
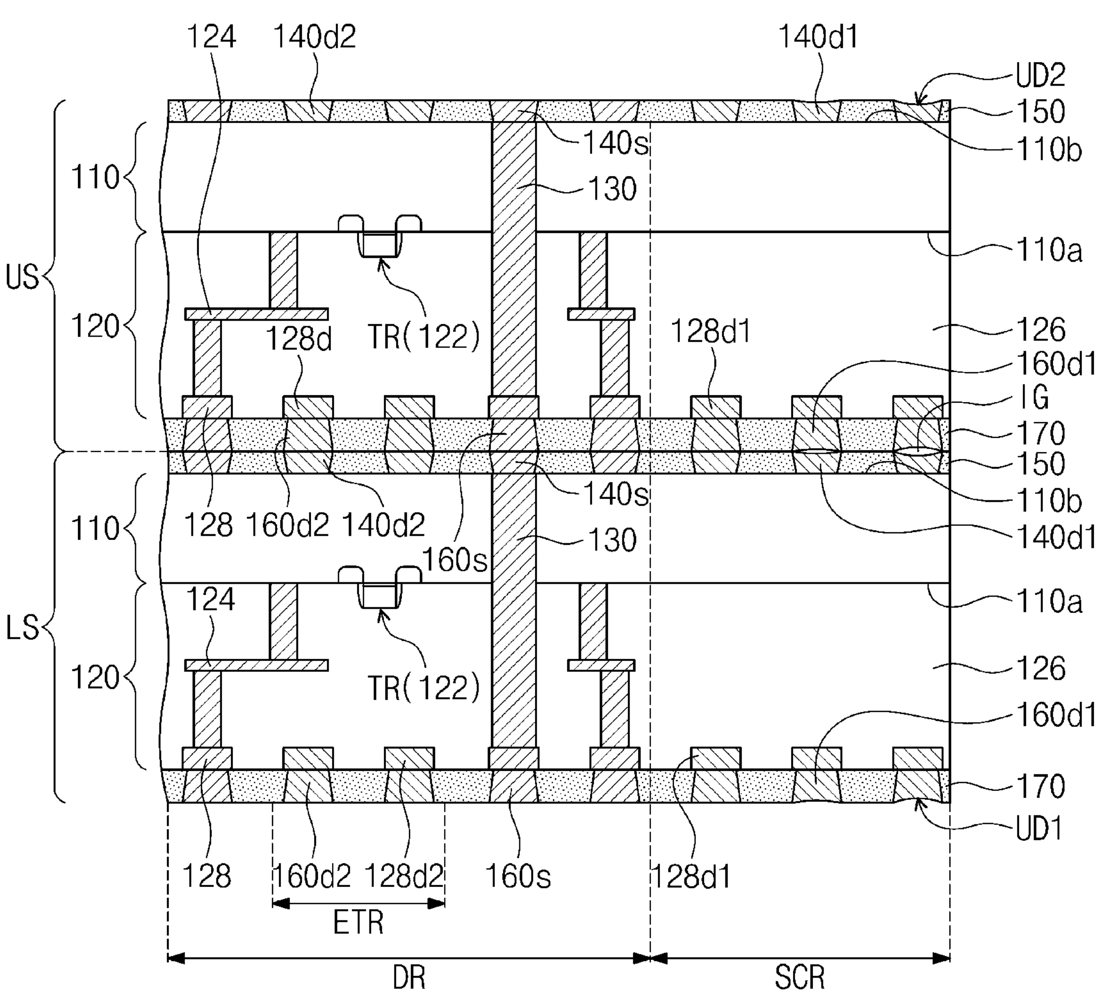

FIG. 12 illustrates a cross-sectional view showing a semiconductor package according to some embodiments of the present inventive concept.

FIG. 11 depicts that only the signal pads 140*s* and 160*s* are provided on the device region DR, but aspects of the present inventive concept are not limited thereto.

Referring to FIG. 12, differently from FIG. 11, the semiconductor substrate 110 may have a device region DR, a scribe lane region SCR, and a dummy region ETR. The device region DR may have therein the dummy region ETR at an area where the signal pads 140*s* and 160*s* are not provided. For example, the device region DR and the dummy region ETR may respectively correspond to the first regions R1 and the second region R2 between the first regions R1 discussed with reference to FIG. 1. A width of the dummy region ETR may be greater than an interval between the first signal pads 160*s* and an interval between the second signal pads 140*s*.

The under-pad pattern 128 may include a portion 128*d*1 (referred to hereinafter as a first dummy wiring pattern) disposed on the scribe lane region SCR. The first dummy wiring pattern 128*d*1 may be electrically insulated from the semiconductor element 122. The under-pad pattern 128 may include another portion 128*d*2 (referred to hereinafter as a second dummy wiring pattern) disposed on the dummy region ETR. The second dummy wiring pattern 128*d*2 may be electrically insulated from the semiconductor element 122. For example, the first dummy wiring pattern 128*d*1 and the second dummy wiring pattern 128*d*2 may be electrically floated from the semiconductor element 122 and a circuit connected to the semiconductor element 122.

The device interlayer dielectric layer 126 may be provided thereon with lower pads 160*s*, 160*d*1, and 160*d*2. The lower pads 160*s*, 160*d*1, and 160*d*2 may be disposed on the under-pad pattern 128, the first dummy wiring pattern 128*d*1, and the second dummy wiring pattern 128*d*2, respectively. The lower pads 160*s*, 160*d*1, and 160*d*2 may include first signal pads 160*s*, first dummy pads 160*d*1, and third dummy pads 160*d*2. The first signal pads 160*s* and the third dummy pads 160*d*2 may correspond to the second signal pads 42 and the second dummy pads 44 discussed with reference to FIG. 1. For example, shapes, sizes, and arrangements of the first signal pads 160*s* and the third dummy pads 160*d*2 may be substantially the same as or similar to those of the second signal pads 42 and the second dummy pads 44 discussed with reference to FIG. 1. The first signal pads 160*s* may be disposed on the device region DR. The first dummy pads 160*d*1 may be disposed on the scribe lane region SCR and may be electrically insulated from the semiconductor element 122. The third dummy pads 160*d*2 may be disposed on the dummy region ETR and may be electrically insulated from the semiconductor element 122.

The semiconductor substrate 110 may be provided with upper pads 140*s*, 140*d*1, and 140*d*2 on the rear surface 110*b* thereof. The upper pads 140*s*, 140*d*1, and 140*d*2 may include second signal pads 140*s*, second dummy pads 140*d*1, and fourth dummy pads 140*d*2. The second signal pads 140*s* and the fourth dummy pads 140*d*2 may correspond to the first signal pads 22 and the first dummy pads 24 discussed with reference to FIG. 1. For example, shapes, sizes, and arrangements of the second signal pads 140*s* and the fourth dummy pads 140*d*2 may be substantially the same as or similar to those of the first signal pads 22 and the first dummy pads 24 discussed with reference to FIG. 1. The second signal pads 140*s* may be disposed on the device region DR. The second dummy pads 140*d*1 may be disposed on the scribe lane region SCR and may be electrically insulated from the vias 130. The fourth dummy pads 140*d*2 may be disposed on the dummy region ETR and may be electrically insulated from the vias 130.

The upper structure US may be connected to the lower structure LS. At an interface between the upper structure US and the lower structure LS, the upper pads 140*s*, 140*d*1, and 140*d*2 of the lower structure LS may be bonded to the lower pads 160*s*, 160*d*1, and 160*d*2 of the upper structure US. The second signal pads 140*s* of the lower structure LS may be bonded to the first signal pads 160*s* of the upper structure US, the second dummy pads 140*d*1 of the lower structure LS may be bonded to the first dummy pads 160*d*1 of the upper structure US, and the fourth dummy pads 140*d*2 of the lower structure LS may be bonded to the third dummy pads 160*d*2 of the upper structure US.

Figure 13:
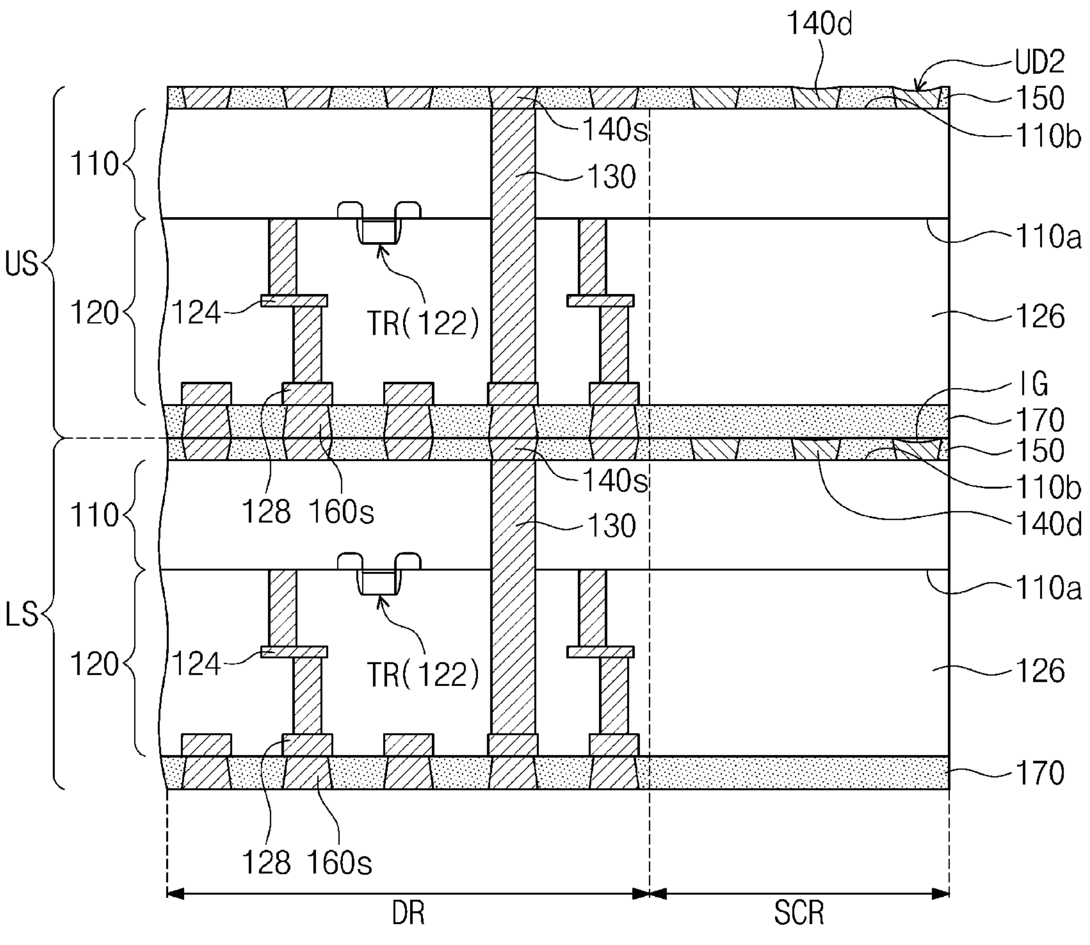
Figure 14:
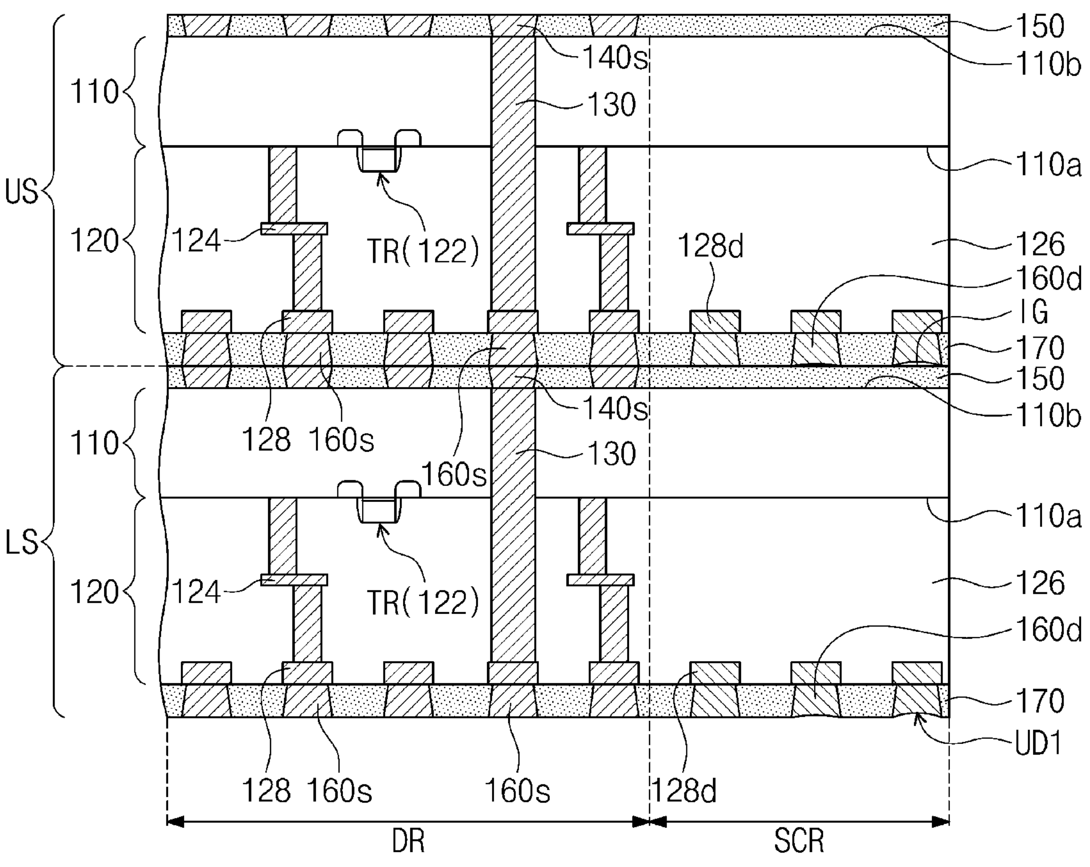

FIGS. 13 and 14 illustrate cross-sectional views showing a semiconductor package according to some embodiments of the present inventive concept.

The embodiment of FIG. 11 shows that the lower structure LS and the upper structure US include all of the first dummy pads 160*d* and the second dummy pads 140*d*, but aspects of the present inventive concept are not limited thereto.

As shown in FIG. 13, neither the lower structure LS nor the upper structure US may have the first dummy pads 160*d*. The upper structure US and the lower structure LS may be in contact with each other. At the interface between the upper structure US and the lower structure LS, the second signal pads 140*s* of the lower structure LS may be bonded to the first signal pads 160*s* of the upper structure US. The second dummy pads 140*d* of the lower structure LS may be in contact with the lower protection layer 170 of the upper structure US.

Alternatively, as shown in FIG. 14, neither the lower structure LS nor the upper structure US may have the second dummy pads 140*d*. The upper structure US and the lower structure LS may be in contact with each other. At the interface between the upper structure US and the lower structure LS, the second signal pads 140*s* of the lower structure LS may be bonded to the first signal pads 160*s* of the upper structure US. The first dummy pads 160*d* of the upper structure US may be in contact with the upper protection layer 150 of the lower structure LS.

Figure 15:
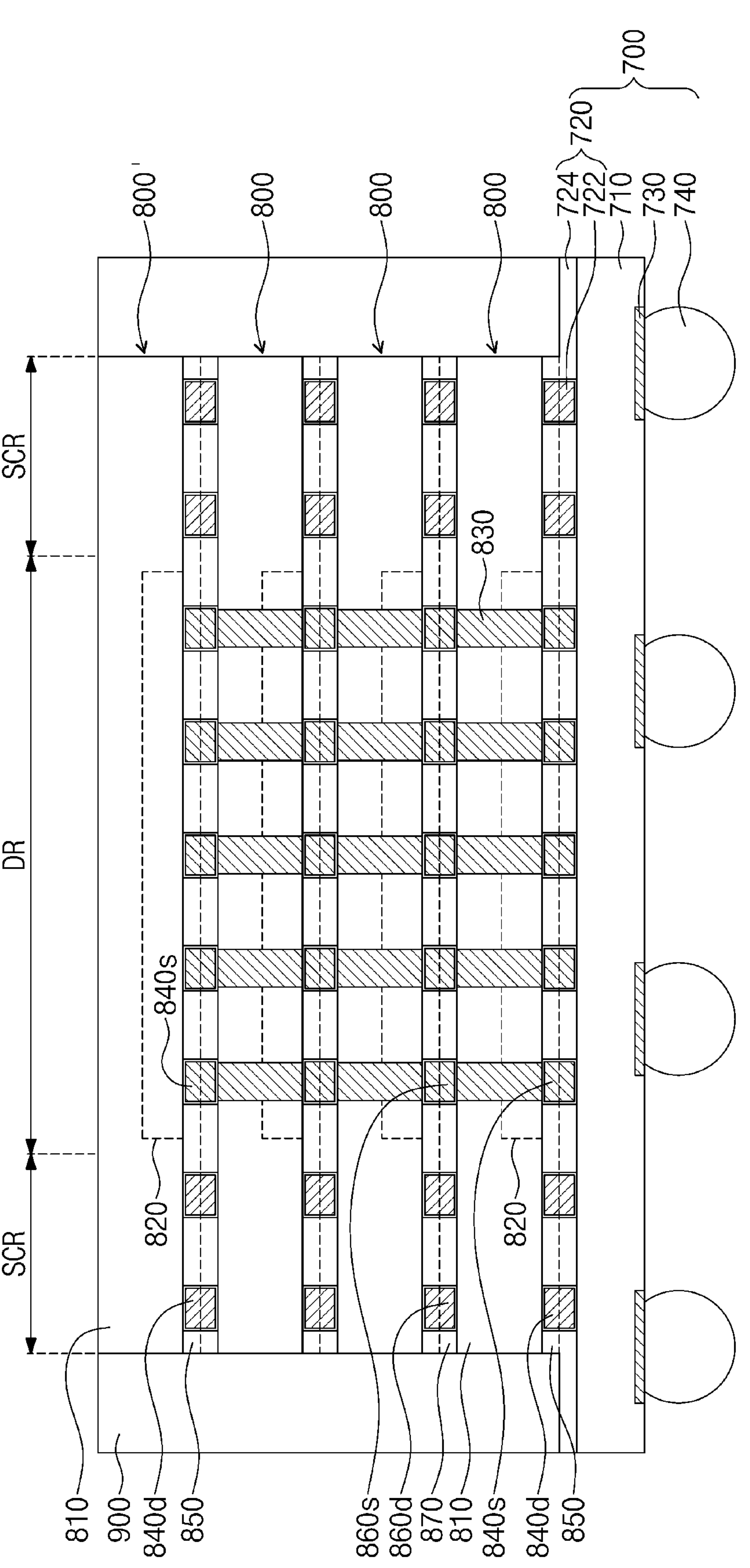
FIG. 15 illustrates a cross-sectional view showing a semiconductor module according to some embodiments of the present inventive concept.

FIG. 15 illustrates a cross-sectional view showing a semiconductor module according to some embodiments of the present inventive concept.

Referring to FIG. 15, a substrate 700 may be provided. The substrate 700 may be a package substrate such as a printed circuit board (PCB) or an interposer substrate provided in a package. Alternatively, the substrate 700 may be a semiconductor substrate on which semiconductor elements are formed or integrated. The substrate 700 may include a substrate base layer 710 and a substrate wiring layer 720 formed on the substrate base layer 710. The substrate wiring layer 720 may include first substrate pads 722 exposed on a top surface of the substrate base layer 710 and a substrate protection layer 724 that covers the substrate base layer 710 and surrounds the first substrate pads 722. Alternatively, the first substrate pads 722 may have their top surfaces coplanar with those of the substrate protection layer 724. Second substrate pads 730 may be provided which are exposed on a bottom surface of the substrate base layer 710. The first substrate pads 722 and the second substrate pads 730 may include a conductive material, such as metal. The first substrate pads 722 and the second substrate pads 730 may include, for example, copper (Cu). The substrate protection layer 724 may include a dielectric material, such as oxide, nitride, or oxynitride of a material included in the substrate base layer 710. For example, the substrate protection layer 724 may include silicon oxide (SiO).

The substrate 700 may have substrate connection terminals 740 disposed on a bottom surface thereof. The substrate connection terminals 740 may be provided on the second substrate pads 730 of the substrate 700. The substrate connection terminals 740 may include solder balls or solder bumps. In accordance with type and arrangement of the substrate connection terminals 740, a semiconductor module may be provided in the form of ball grid array (BGA), fine ball grid array (FBGA), or land grid array (LGA).

A chip stack may be disposed on the substrate 700. The chip stack may include one or more semiconductor chips 800 and 800' stacked on the substrate 700. Each of the semiconductor chips 800 and 800' may be a memory chip, such as DRAM, SRAM, MRAM, or Flash memory. Alternatively, each of the semiconductor chips 800 and 800' may be a logic chip. FIG. 15 depicts that one chip stack is disposed, but aspects of the present inventive concept are not limited thereto. When the chip stack is provided in plural, the chip stacks may be spaced apart from each other on the substrate 700.

Each of the semiconductor chips 800 and 800' may include a semiconductor substrate 810, a circuit layer 820, a via 830, a lower signal pad 840*s*, a lower dummy pad 840*d*, a lower protection layer 850, an upper signal pad 860*s*, an upper dummy pad 860*d*, and an upper protection layer 870. Each of the semiconductor chips 800 and 800' may correspond to one semiconductor die. The semiconductor chip 800' disposed at top end may not include any of the via 830, the upper signal pad 860*s*, the upper dummy pad 860*d*, and the upper protection layer 870.

Each of the semiconductor chips 800 and 800' may have a structure the same as or similar to that of the lower structure LS or the upper structure US discussed with reference to FIGS. 11-14. The description of the lower structure LS or the upper structure US of FIGS. 11-14 may be applicable to the semiconductor chips 800 and 800'.

The substrate 700 may be provided thereon with a molding layer 900 that covers the chip stack. The molding layer 900 may protect the chip stack. The molding layer 900 may include a dielectric material. For example, the molding layer 900 may include an epoxy molding compound (EMC).

FIGS. 16-21 illustrate cross-sectional views showing a method of fabricating a semiconductor package according to some embodiments of the present inventive concepts.

Figure 16:
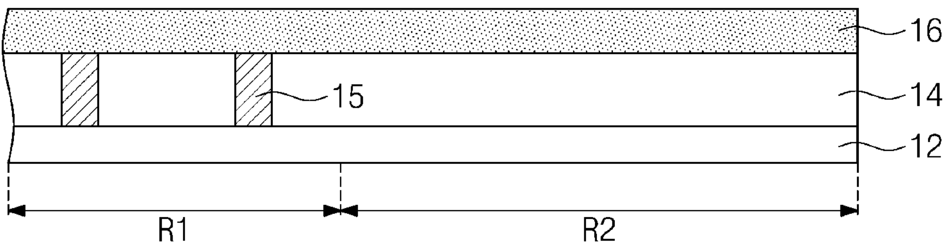
FIGS. 16-21 illustrate cross-sectional views showing a method of fabricating a semiconductor package according to some embodiments of the present inventive concept.

Referring to FIG. 16, a first substrate 12 may be provided. The first substrate 12 may be a semiconductor substrate. The first substrate 12 may have a first region R1 and a second region R2 on one side of the first region R1. The first region R1 may be disposed on a central portion of the first substrate 12, and the second region R2 may be disposed on an edge portion of the first substrate 12. For example, the second region R2 may be positioned between the first region R1 and a lateral surface of the first substrate 12, and when viewed in a plan view, the second region R2 may surround the first region R1. The first region R1 may be a device region where semiconductor elements are formed on the central portion of the first substrate 12, and the second region R2 may be a region where no semiconductor elements are formed on the edge region of the first substrate 12.

A first circuit layer 14 may be formed on the first substrate 12. The first circuit layer 14 may have a first connection line 15 for connecting the first substrate 12 to first pads (see 20 of FIG. 19). The first connection line 15 may be formed on the first region R1.

A dielectric material may be deposited to form a first dielectric layer 16 on the first circuit layer 14. The first dielectric layer 16 may cover the first circuit layer 14 on the first region R1 and the second region R2.

Figure 17:
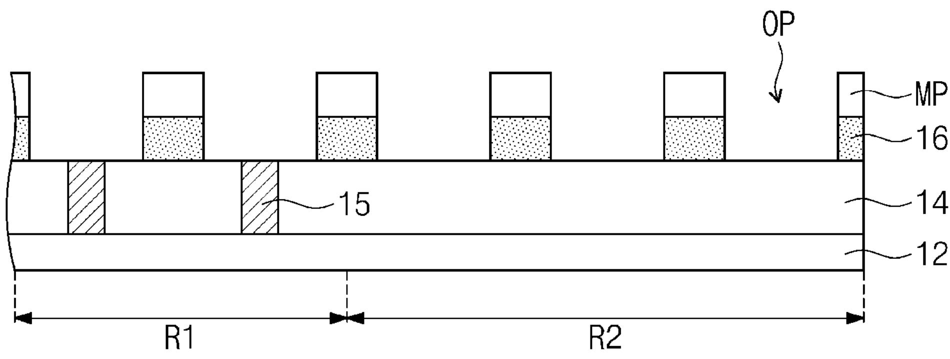

Referring to FIG. 17, the first dielectric layer 16 may be patterned to form openings OP in which the first pads (see 20 of FIG. 19) are provided. For example, a mask pattern MP may be formed on the first dielectric layer 16, and then the mask pattern MP may be used as an etching mask to pattern the first dielectric layer 16. The patterning process may continue until the first circuit layer 14 is exposed. For example, one or more of the openings OP may expose the first connection line 15 on the first region R1. Other one or more of the openings OP may expose a top surface of the first circuit layer 14 on the second region R2.

Figure 18:
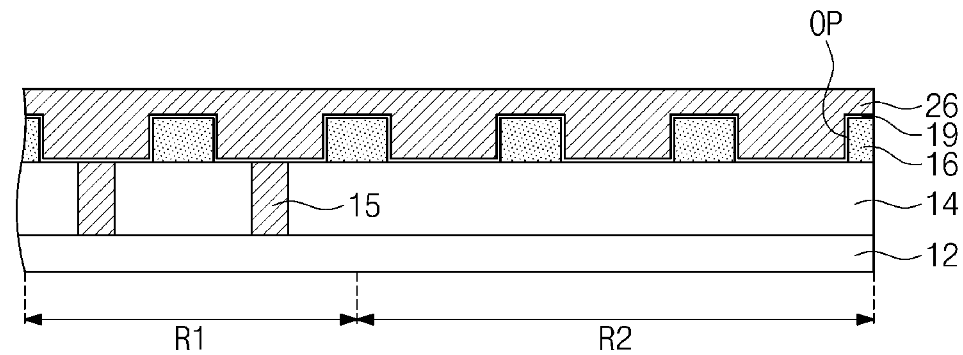

Referring to FIG. 18, the mask pattern MP may be removed.

A first seed/barrier layer 19 may be formed on the first dielectric layer 16. The first seed/barrier layer 19 may be formed to conformally cover the first dielectric layer 16. For example, the first seed/barrier layer 19 may cover a top surface of the first dielectric layer 16 and may also cover bottom and inner lateral surfaces of the openings OP.

A first conductive layer 26 may be formed on the first dielectric layer 16, filing the openings OP. The formation of the first conductive layer 26 may include a plating process in which the first seed/barrier layer 19 is used as a seed. The first conductive layer 26 may include a metallic material, such as copper (Cu). The first conductive layer 26 may cover the top surface of the first dielectric layer 16.

Figure 19:
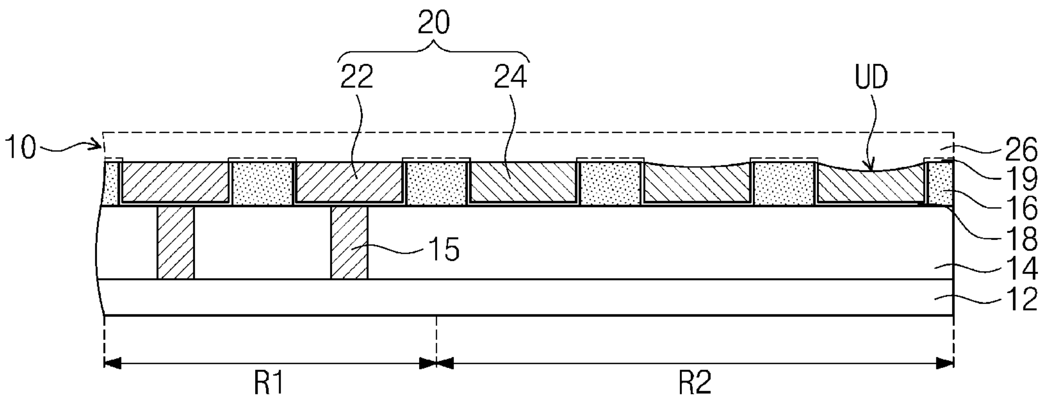

Referring to FIG. 19, a first planarization process may be performed on the first conductive layer 26. The first planarization process may include a chemical mechanical polishing (CMP) process. In the first planarization process, first pads 20 and first seed/barrier patterns 18 may be formed in the openings OP. For example, the first conductive layer 26 and the first seed/barrier layer 19 may be partially removed from the top surface of the first dielectric layer 16, and the top surface of the first dielectric layer 16 may be exposed. The first pads 20 may include first signal pads 22 positioned on the first region R1 and first dummy pads 24 positioned on the second region R2.

The first conductive layer 26 may be over-etched during the first planarization process. For example, at least one of the first pads 20 may be over-etched to have a concave top surface. No over-etching may be performed on the first signal pads 22 positioned on the first region R1 disposed on the central portion of the first substrate 12. An over-etching may be performed on the first dummy pads 24 positioned on the second region R2 disposed on the edge portion of the first substrate 12. For example, during the first planarization process, the first dummy pads 24 may be formed to have concave portions UD on top surfaces thereof. The first signal pads 22 may have their top surfaces that are substantially flat and coplanar with that of the first dielectric layer 16. A reduction in distance between the first pad 20 and the lateral surface of the first substrate 12 may cause an increase in over-etched depth of the first conductive layer 26 or an increase in depth of the concave portion UD. Through the processes mentioned above, a lower structure 10 may be formed.

Figure 20:
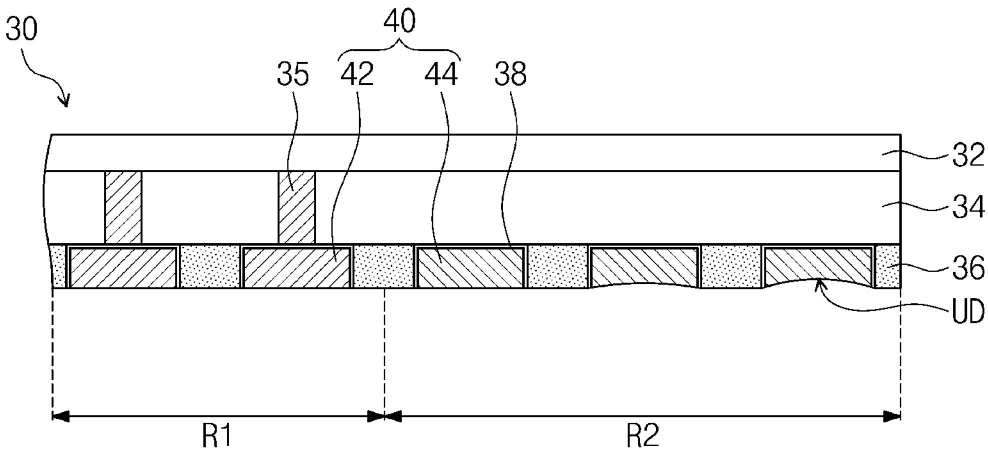
Figure 21:
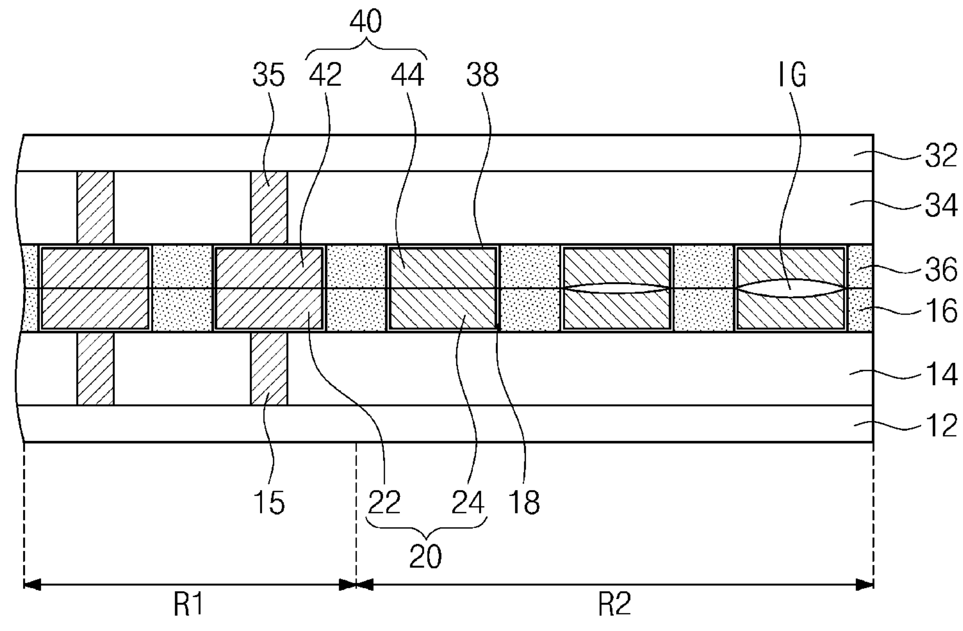

Referring to FIG. 20, an upper structure 30 may be formed. The formation of the upper structure 30 may be substantially the same as or similar to the formation of the lower structure 10. For example, a second substrate 32 may be provided which has a first region R1 and a second region R2. A second circuit layer 34 may be formed on the second substrate 32. A second dielectric layer 36 may be formed on the second circuit layer 34. The second dielectric layer 36 may be patterned, and then openings of the second dielectric layer 36 may be filled with a conductive material to form a second seed/barrier layer and a second conductive layer. The second conductive layer and the second seed/barrier layer may undergo a second planarization process to form second pads 40. The second pads 40 may include second signal pads 42 positioned on the first region R1 and second dummy pads 44 positioned on the second region R2.

The second conductive layer may be over-etched during the second planarization process. For example, at least one of the second pads 40 may be over-etched to have a concave bottom surface. No over-etching may be performed on the second signal pads 42 positioned on the first region R1 or a central portion of the second substrate 32. An over-etching may be performed on the second dummy pads 44 positioned on the second region R2 disposed on an edge portion of the second substrate 32. For example, during the second planarization process, the second dummy pads 44 may be formed to have concave portions UD on bottom surfaces thereof. The second signal pads 42 may have their bottom surfaces that are substantially flat and coplanar with that of the second dielectric layer 36. A reduction in distance between the second pad 40 and a lateral surface of the second substrate 32 may cause an increase in depth of the concave portion UD. Through the processes mentioned above, the upper structure 30 may be formed.

Referring back to FIG. 21, the upper structure 30 may be provided on the lower structure 10. For example, the upper structure 30 may be placed on the lower structure 10 to allow the first pads 20 to vertically align with the second pads 40.

Afterwards, the lower structure 10 and the upper structure 30 may be in contact with each other. The top surface of the first dielectric layer 16 included in the lower structure 10 may be in contact with the bottom surface of the second dielectric layer 36 included in the upper structure 30. The top surfaces of the first pads 20 included in the lower structure 10 may be in contact with the bottom surfaces of the second pads 40 included in the upper structure 30. In accordance with shapes of the concave portions (see UD of FIG. 19) formed on the first dummy pads 24 and shapes of the concave portions (see UD of FIG. 20) formed on the second dummy pads 44, one or more gaps IG may be formed between the first dummy pads 24 and the second dummy pads 44.

An annealing process may be performed on the lower structure 10 and the upper structure 30. The annealing process may bond the first signal pads 22 of the lower structure 10 to the second signal pads 42 of the upper structure 30, and may also bond the first dummy pads 24 of the lower structure 10 to the second dummy pads 44 of the upper structure 30. The bonding between the first pads 20 and the second pads 40 may be performed automatically. For example, the first pad 20 and the second pad 40 may be formed of the same material (e.g., copper (Cu)), and may be bonded to each other by an intermetallic hybrid bonding process resulting from surface activation at an interface between the first pad 20 and the second pad 40 that are in contact with each other. The first dummy pad 24 and the second dummy pad 44 that are spaced apart from each other across the gap IG may not be bonded to each other during the annealing process.

The annealing process may bond the first dielectric layer 16 of the lower structure 10 to the second dielectric layer 36 of the upper structure 30. For example, in the annealing process, the first dielectric layer 16 and the second dielectric layer 36 may form a silicon oxide (SiO) layer. For example, the first dielectric layer 16 and the second dielectric layer 36 may all include silicon oxide (SiO), and may be combined to form a single unitary body during the annealing process.

According to some embodiments of the present inventive concept, among a plurality of pads disposed adjacent to each other, the dummy pads 24 and 44 may be located on edge areas of the substrates 12 and 32, compared to the signal pads 22 and 42. One or more pads outside positioned among the first and second pads 20 and 40 may be over-etched during the planarization process for forming the first pads 20 or the second pads 40. For example, according to some embodiments of the present inventive concepts, the outside positioned dummy pads 24 and 44 may be over-etched instead of the signal pads 22 and 42. Therefore, the signal pads 22 and 42 may be prevented from bonding failure caused by concave portions formed on pads in a bonding process between the lower structure 10 and the upper structure 30. Although bonding failure occurs between the dummy pads 24 and 44 having the concave portions UD formed thereon, the dummy pads 24 and 44 may be irrelevant to electrical circuits and connection lines of semiconductor packages, and bonding failure between the dummy pads 24 and 44 may have no effect on electrical properties of semiconductor packages. Accordingly, it may be possible to provide a semiconductor fabrication method having less occurrence of failure and a semiconductor package having increased structural stability and improved electrical properties.

In a method of fabricating a semiconductor package according to some embodiments of the present inventive concept, compared to signal pads, dummy pads among a plurality of pads disposed adjacent to each other may be located on edge areas of a semiconductor substrate. One or more pads located in an outside position among the pads, may be over-etched during a planarization process for forming pads of an upper structure or a lower structure. According to some embodiments of the present inventive concept, the outside positioned dummy pads may be over-etched instead of the signal pads. Therefore, the signal pads may be prevented from bonding failure caused by concave portions formed on pads in a bonding process between the lower structure and the upper structure. Although bonding failure occurs between the dummy pads having concave portions formed thereon, the dummy pads may be irrelevant to electrical circuits and connection lines of semiconductor packages, and bonding failure between the dummy pads may have no effect on electrical properties of semiconductor packages. Accordingly, it may be possible to provide a semiconductor fabrication method having less occurrence of failure and a semiconductor package having increased structural stability and improved electrical properties.

Although aspects of the present inventive concept have been described in connection with some embodiments of the present inventive concept illustrated in the accompanying drawings, it will be understood by one of ordinary skill in the art that variations in form and detail may be made therein without departing from the spirit and essential feature of aspects of the present inventive concept. The above disclosed embodiments should thus be considered illustrative and not restrictive.

What is claimed is:

1. A semiconductor package, comprising:
a lower structure; and
an upper structure on the lower structure,
wherein the lower structure includes:
a first semiconductor substrate;
first through vias that vertically penetrate the first semiconductor substrate;
first signal pads on the first semiconductor substrate, wherein the first signal pads are connected to the first through vias;
first dummy pads on the first semiconductor substrate, wherein the first dummy pads are disposed between the first signal pads in a plan view, and the first dummy pads are electrically separated from the first through vias; and
a first dielectric layer on the first semiconductor substrate, wherein the first dielectric layer surrounds the first signal pads and the first dummy pads, wherein the upper structure includes:
a second semiconductor substrate;
second signal pads and second dummy pads on the second semiconductor substrate; and
a second dielectric layer on the second semiconductor substrate, wherein the second dielectric layer surrounds the second signal pads and the second dummy pads,
wherein each of the first signal pads is in contact with one of the second signal pads,
wherein each of the first dummy pads is in contact with one of the second dummy pads, and
wherein a first interval between the first dummy pads is about 0.5 times to about 1.5 times a second interval between the first signal pads.

2. The semiconductor package of claim 1, wherein a third interval between the first dummy pad and the first signal pad that are adjacent to each other among the first dummy pads and the first signal pads is about 0.5 times to about 1.5 times the second interval between the first signal pads.

3. The semiconductor package of claim 1, wherein a width of the first dummy pad is about 0.8 times to about 1.2 times a width of the first signal pad.

4. The semiconductor package of claim 1, wherein the number of the first signal pads in the lower structure is about 10 times to about 100 times the number of the first dummy pads in the lower structure.

5. The semiconductor package of claim 1, wherein the first signal pads and the first dummy pads include a circular, tetragonal, octagonal, or polygonal planar shape.

6. The semiconductor package of claim 1, wherein the first dummy pads are arranged in a square fashion or a honeycomb fashion when viewed in a plan view.

7. The semiconductor package of claim 1, wherein the lower structure further includes a dummy wiring line in the first semiconductor substrate and connected to the first dummy pads, and
wherein the dummy wiring line is electrically floated from the first through vias.

8. The semiconductor package of claim 1, wherein
the first semiconductor substrate includes a device region on which the first signal pads and the first dummy pads are provided and a scribe lane region that surrounds the device region,
the lower structure further includes third dummy pads on the scribe lane region, and
when viewed in a plan view, the third dummy pads are between the first signal pads and a lateral surface of the first semiconductor substrate.

9. The semiconductor package of claim 8, wherein
top surfaces of the first signal pads are flat,
top surfaces of the third dummy pads have concave portions toward the first semiconductor substrate, and
bottom ends of the top surfaces of the third dummy pads are closer than the top surfaces of the first signal pads to the first semiconductor substrate.

10. The semiconductor package of claim 1, wherein
each of the first signal pads and a corresponding one of the second signal pads are in contact with each other to constitute a single unitary body formed of the same material, and
each of the first dummy pads and a corresponding one of the second dummy pads are in contact with each other to constitute a single unitary body formed of the same material.

11. The semiconductor package of claim 1, wherein top surfaces of the first signal pads and a top surface of the first dielectric layer are flat and coplanar with each other.

12. A semiconductor package, comprising:
a lower structure; and
an upper structure on the lower structure,
wherein the lower structure includes:
a first semiconductor substrate that has a first region and a second region on one side of the first region;
first through vias on the first region, wherein the first through vias vertically penetrate the first semiconductor substrate;
first signal pads on the first region, wherein the first signal pads are on the first semiconductor substrate and connected to the first through vias;
first dummy pads on the second region, wherein the first dummy pads are on the first semiconductor substrate and electrically floated from the first through vias; and
a first dielectric layer on the first semiconductor substrate, wherein the first dielectric layer surrounds the first signal pads and the first dummy pads,
wherein the upper structure includes:
a second semiconductor substrate;
second signal pads on the second semiconductor substrate; and
a second dielectric layer on the second semiconductor substrate, wherein the second dielectric layer surrounds the second signal pads,
wherein the first dielectric layer and the second dielectric layer are in contact with each other,
wherein each of the first signal pads and a corresponding one of the second signal pads constitute a single unitary body formed of the same material,
wherein an arrangement period of the first dummy pads is about 0.5 times to about 1.5 times an arrangement period of the first signal pads,
wherein the first region is provided in plural, and
wherein the second region is disposed between the first regions.

13. The semiconductor package of claim 12, wherein a first interval between one of the first signal pads and one of the first dummy pads is about 0.5 times to about 1.5 times a second interval between the first signal pads, the one of the first signal pads and the one of the first dummy pads being adjacent to an interface between the first region and the second region.

14. The semiconductor package of claim 12, wherein
the first region corresponds to a device region on a central portion of the first semiconductor substrate, and
the second region corresponds to a scribe lane region on an edge portion of the first semiconductor substrate, the scribe lane region surrounding the device region.

15. The semiconductor package of claim 12, wherein
the upper structure further includes second dummy pads on the second semiconductor substrate and spaced apart from the second signal pads,
on the second semiconductor substrate, the second dielectric layer surrounds the second signal pads and the second dummy pads, and
each of the first dummy pads and a corresponding one of the second dummy pads constitute a single unitary body formed of the same material.

16. The semiconductor package of claim 12, wherein a top surface of the first dielectric layer and top surfaces of the first signal pads are flat and coplanar with each other.

17. The semiconductor package of claim 12, wherein at least one of the first dummy pads has a concave portion recessed toward the first semiconductor substrate from a top surface of the first dielectric layer.

18. The semiconductor package of claim 17, wherein an increase in distance between the first region and the first dummy pads corresponds to an increase in depth of the concave portion of the first dummy pad.

19. A semiconductor package, comprising:
a substrate;
semiconductor dies stacked on the substrate; and
a molding layer on the substrate, wherein the molding layer surrounds the semiconductor dies,
wherein each of the semiconductor dies includes:
a semiconductor substrate having a device region and a scribe lane region that surrounds the device region;
first signal pads on the device region, wherein the first signal pads are on an inactive surface of the semiconductor substrate;
first dummy pads on the device region, wherein the first dummy pads are on the inactive surface of the semiconductor substrate, and the first dummy pads are between the first signal pads;
second dummy pads on the scribe lane region, wherein the second dummy pads are on the inactive surface of the semiconductor substrate; and
through vias that vertically penetrate the semiconductor substrate, wherein the through vias are connected to the first signal pads,
wherein the semiconductor dies vertically adjacent to each other are in contact with and bonded to each other,
wherein top surfaces of the first signal pads are flat, and
wherein at least one of the second dummy pads has a concave portion recessed toward the semiconductor substrate.

* * * * *